(12) United States Patent
Yang et al.

(10) Patent No.: US 8,008,665 B2
(45) Date of Patent: Aug. 30, 2011

(54) FAN-OUT, DISPLAY SUBSTRATE HAVING THE SAME AND METHOD FOR MANUFACTURING THE DISPLAY SUBSTRATE

(75) Inventors: Sung-Hoon Yang, Yongin-si (KR); So-Woon Kim, Suwon-si (KR); Chong-Chul Chai, Seoul (KR); Joo-Ae Youn, Seongnam-si (KR); Kyoung-Ju Shin, Hwaseong-si (KR); Yeon-Ju Kim, Suwon-si (KR); Soo-Wan Yoon, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 841 days.

(21) Appl. No.: 11/924,111

(22) Filed: Oct. 25, 2007

(65) Prior Publication Data
US 2008/0157364 A1    Jul. 3, 2008

(30) Foreign Application Priority Data

Jan. 2, 2007    (KR) .................. 10-2007-0000109
Feb. 8, 2007   (KR) .................. 10-2007-0013365

(51) Int. Cl.
*H01L 27/14* (2006.01)

(52) U.S. Cl. ............ 257/72; 257/59; 438/149; 438/151; 349/149; 349/152

(58) Field of Classification Search ................ 257/59, 257/72; 438/149, 151; 349/149, 152
See application file for complete search history.

(56) References Cited

U.S. PATENT DOCUMENTS

| | | | |
|---|---|---|---|
| 6,774,414 B2 * | 8/2004 | Chang ................... | 257/208 |
| 6,842,200 B1 * | 1/2005 | Su et al. ................. | 349/38 |
| 7,271,871 B2 * | 9/2007 | Jen et al. ............... | 349/152 |
| 7,499,141 B2 * | 3/2009 | Lai ....................... | 349/149 |
| 2002/0060833 A1 * | 5/2002 | Yamaguchi ............. | 359/245 |
| 2003/0086048 A1 * | 5/2003 | Ukita .................... | 349/149 |

* cited by examiner

*Primary Examiner* — Eugene Lee
*Assistant Examiner* — Anthony Ho
(74) *Attorney, Agent, or Firm* — H.C. Park & Associates, PLC

(57) ABSTRACT

A display substrate having a fan-out and a method for manufacturing the display substrate are disclosed. The fan-out includes an insulating substrate, a first line, a second line, a resistance control pattern, and first and second detour pattern. The first line is disposed on the insulating substrate and is connected to a pad. The second line is formed from the same layer as the first line and is connected to a thin-film transistor (TFT). The resistance control pattern is formed from a different layer than the first and second lines. The first and second detour patterns are formed from a different layer than the first and second lines and the resistance control pattern, and connect the first and second lines with the resistance control pattern, respectively.

20 Claims, 17 Drawing Sheets

FAN-OUT, DISPLAY SUBSTRATE HAVING THE SAME AND METHOD FOR MANUFACTURING THE DISPLAY SUBSTRATE

CROSS-REFERENCE TO RELATED APPLICATIONS

This application claims priority from and the benefit of Korean Patent Application No. 10-2007-0000109, filed on Jan. 2, 2007, and Korean Patent Application No. 10-2007-0013365, filed on Feb. 8, 2007, which are hereby incorporated by reference for all purposes as if fully set forth herein.

BACKGROUND OF THE INVENTION

1. Field of the Invention

The present invention relates to a fan-out. More particularly, the present invention relates to a fan-out, a display substrate including the fan-out, and a method for manufacturing the display substrate.

2. Discussion of the Background

Generally, a display substrate includes a pixel area in which signal lines cross each other to define a plurality of unit pixels, and a peripheral area surrounding the pixel area. A thin-film transistor (TFT) connected to the signal lines and a pixel electrode to receive a pixel voltage from the TFT are formed in the unit pixel defined in the pixel area.

Pads contacting an external driving signal applying part and fan-out lines connecting the signal lines with the pads, respectively, are formed in the peripheral area.

The distance between adjacent pads is smaller than that between adjacent signal lines forming the unit pixel, so the length of each fan-out line depends on a straight distance between the pad and the signal line corresponding to the pad.

Accordingly, the length differences between the fan-out lines cause resistance differences between the fan-out lines, so the display substrate may not be uniformly driven.

SUMMARY OF THE INVENTION

The present invention provides a fan-out that may be capable of decreasing resistance differences due to length differences between fan-out lines.

The present invention also provides a display substrate including the fan-out.

The present invention also provides a method for manufacturing the display substrate.

Additional features of the invention will be set forth in the description which follows, and in part will be apparent from the description, or may be learned by practice of the invention.

The present invention discloses a fan-out including an insulating substrate, a first line, a second line, a resistance control pattern, and first and second detour patterns. The first line is disposed on the insulating substrate and connected to a pad. The second line is formed from the same layer as the first line and is connected to a thin-film transistor (TFT). The resistance control pattern is formed from a different layer than the first and second lines. The first and second detour patterns are formed from a different layer than the first and second lines and the resistance control pattern, and connect the first and second lines with the resistance control pattern, respectively.

The present invention also discloses a fan-out including an insulating substrate, a first line, a second line, a resistance control pattern, and a first detour pattern. The first line is disposed on the insulating substrate and connected to a pad. The second line is formed from the same layer as the first line and is connected to a TFT. The resistance control pattern is formed from a different layer than the first and second lines. The first detour pattern is formed from a different layer than the first line, the second line, and the resistance control pattern, and connects the first line to the resistance control pattern.

The present invention also discloses a display substrate including a fan-out, and a gate line or a data line connected to the fan-out. The fan-out includes an insulating substrate, a first line, a second line, a resistance control pattern, and first and second detour patterns. The first line is disposed on the insulating substrate and is connected to a pad. The second line is formed from the same layer as the first line and is connected to a TFT. The resistance control pattern is formed from a different layer than the first and second lines. The first and second detour patterns are formed from a different layer than the first and second lines and the resistance control pattern, and connect the first and second lines with the resistance control pattern, respectively.

The present invention also discloses a display substrate including an insulating substrate, signal lines, signal pads, and a fan-out line. The insulating substrate is divided into a pixel area and a peripheral area. The signal lines cross each other in the pixel area to define unit pixels. The signal pads are disposed in the peripheral area to receive a driving signal. The fan-out line is disposed between the signal lines and the signal pads corresponding to the signal lines, and includes island portions spaced apart from each other and at least one first bridge portion that is formed from a different layer than the island portions and connects the island portions to each other.

The present invention also discloses a method for manufacturing a display substrate including forming first and second lines. A first insulating layer is formed on the first and second lines. A first contact hole is formed through the first insulating layer to expose the first line or the second line. A first detour pattern or a second detour pattern is formed to be connected to the first line or the second line through the contact hole.

The present invention also discloses a method for manufacturing a display substrate including forming first and second lines. A first insulating layer is formed on the first and second lines. A first detour pattern or a second detour pattern is formed on the first insulating layer. A second insulating layer is formed on the first detour pattern or the second detour pattern. The first insulating layer is patterned to form contact holes exposing the first line and the second line, and the second insulating layer is patterned to form a contact hole exposing the first detour pattern or the second detour pattern.

The present invention also discloses a method for manufacturing a display substrate including forming a gate metal pattern on a substrate. A first insulating layer is formed on the substrate having the gate metal pattern formed thereon. A data metal pattern having a data line and a data pad is formed on the first insulating layer. Data island portions are formed from at least one of the gate and data metal pattern, and the data island portions are spaced apart from each other between the data line and the data pad. A second insulating layer is formed on the substrate having the data metal pattern formed thereon. A first hole exposing both end portions of the data island portions is formed via patterning of the first and second insulating layers at the same time. A conductive material layer is formed on the second insulating layer. At least one first bridge portion contacting adjacent data island portions through the first holes, is formed via patterning of the conductive material layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
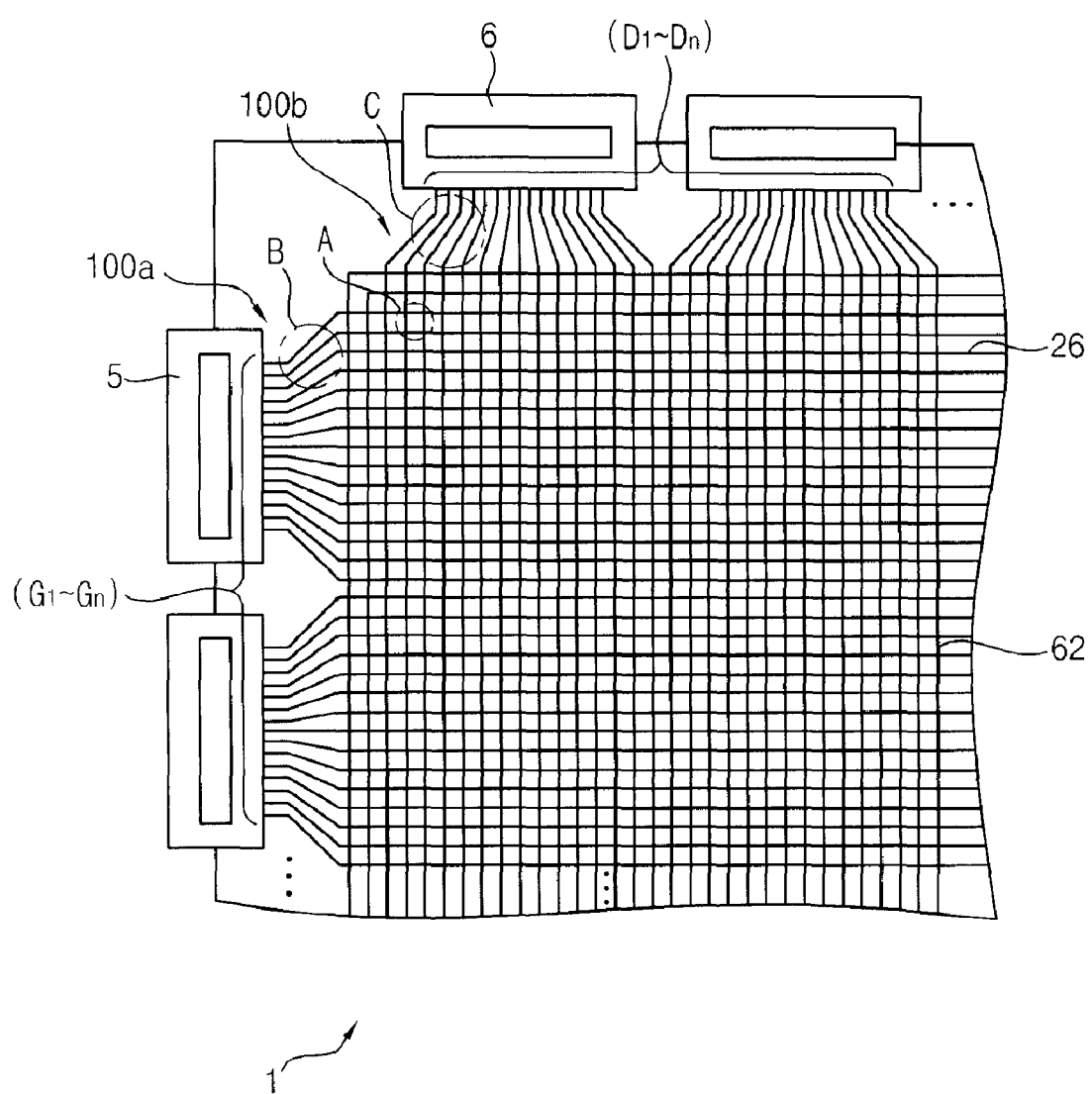
FIG. 1 is a plan view showing a display substrate having a fan-out according to a first exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

Figure 2A:
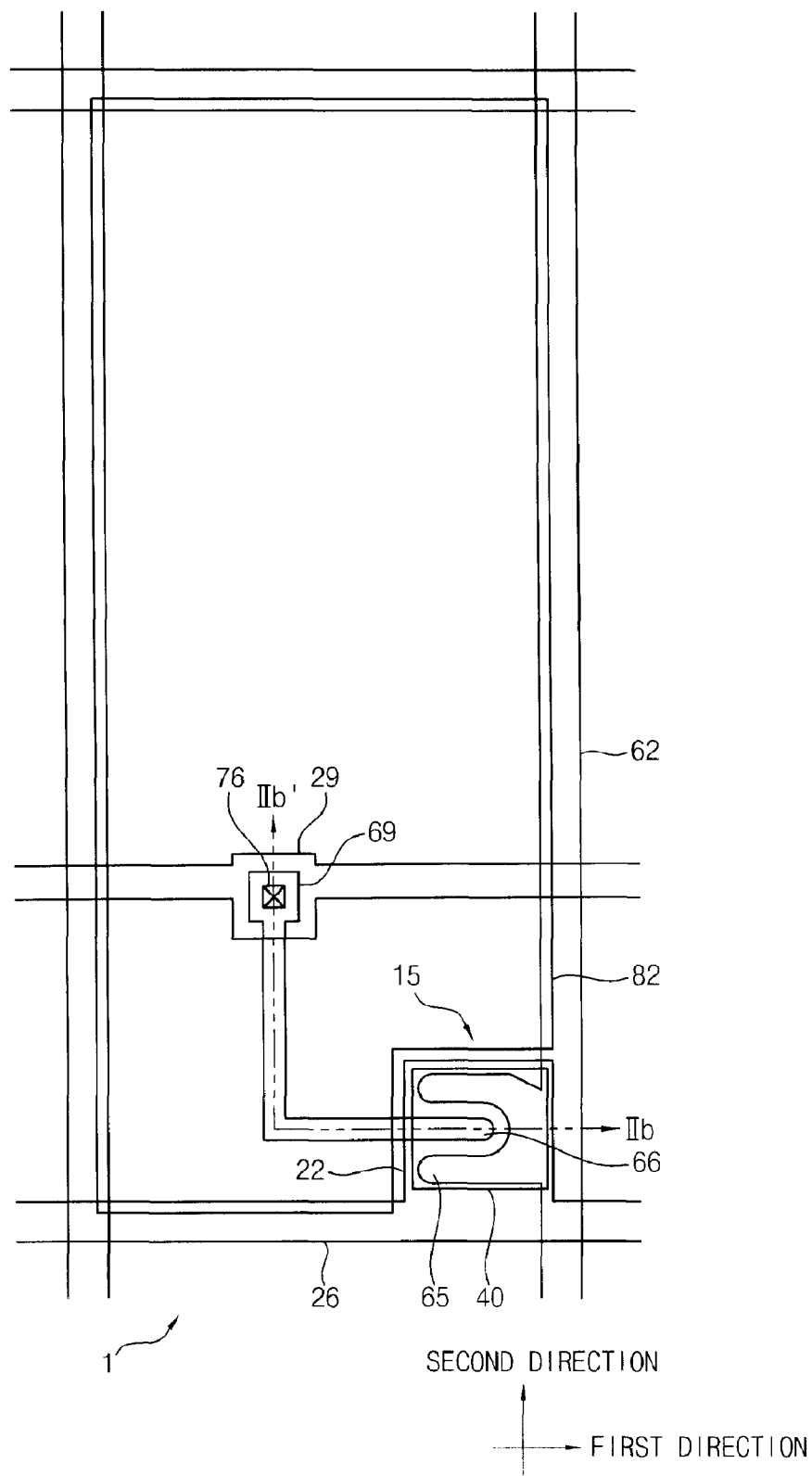
FIG. 2A is an enlarged plan view showing a portion A of FIG. 1.
Figure 2B:
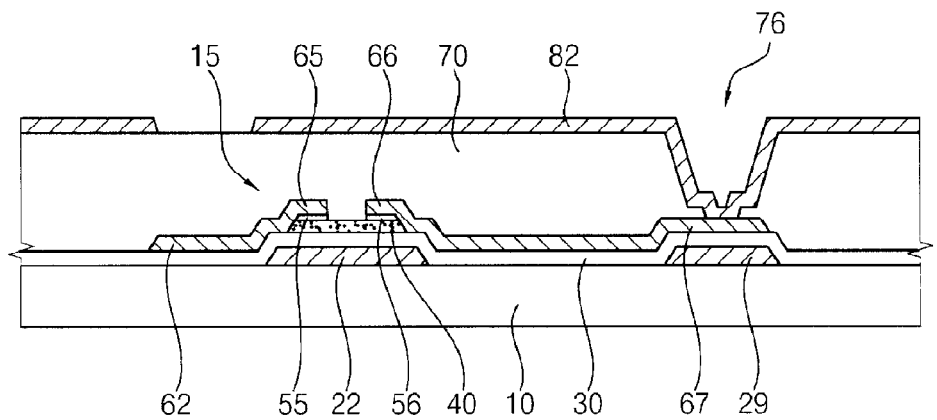
FIG. 2B is a cross-sectional view taken along line IIb-IIb' of FIG. 2A.

FIG. 1 is a plan view showing a display substrate 1 having a fan-out according to a first exemplary embodiment of the present invention. FIG. 2A is an enlarged plan view showing a portion A of FIG. 1. FIG. 2B is a cross-sectional view taken along line IIb-IIb' of FIG. 2A.

Referring to FIG. 1, FIG. 2A, and FIG. 2B, the display substrate 1 according to the present exemplary embodiment is a display plate on which a plurality of thin-film transistors (TFT) is arranged. The TFT is formed from thin films that are formed on an insulating substrate 10 via a vacuum deposition process. The TFT is a switching element that controls liquid crystal based on an electric signal. The display substrate 1 includes a gate metal pattern 22 and 26, a data metal pattern 62, 65, and 66, a pixel electrode 82, and a fan-out assembly 100a and 100b.

The display substrate according to the present exemplary embodiment includes the gate metal pattern 22 and 26, a first insulating layer 30, a semiconductor layer 40, an ohmic contact layer 55 and 56, the data metal pattern 62, 65, and 66, a maintenance electrode 29, a second insulating layer 70, and a pixel electrode 82. The gate metal pattern 22 and 26, the first insulating layer 30, the semiconductor layer 40, the ohmic contact layer 55 and 56, the data metal pattern 62, 65, and 66, the maintenance electrode 29, the second insulating layer 70, and the pixel electrode 82 are formed on the insulating substrate 10.

The insulating substrate 10 includes a material having heat resistance and light transmissivity such as transparent glass or plastic.

The gate metal pattern 22 and 26 is formed on the insulating substrate 10. Examples of a material that can be used for the gate metal pattern 22 and 26 may include an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), titanium (Ti), and tantalum (Ta). In addition, the gate metal pattern 22 and 26 may have a double-layered structure including two conductive layers (not shown) having physical characteristics different from each other.

The gate metal pattern 22 and 26 includes a gate line 26 extending in a first direction and a gate electrode 22 protruding from the gate line 26.

For example, the gate metal pattern 22 and 26 includes the gate line 26 extending in the first direction to apply a gate signal to the gate electrode 22 and the gate electrode 22 protruding from the gate line 26. The gate electrode 22 forms one of terminals of the TFT 15, which will be described later.

The first insulating layer 30 is formed on the gate metal pattern 22 and 26, and the first insulating layer 30 may include an insulating material such as silicon nitride ($SiN_x$).

The semiconductor layer 40 is formed on the first insulating layer 30, and may include hydrogenated amorphous silicon or multi-crystalline silicon. The semiconductor layer 40 may have various shapes such as an island shape or a linear shape. For example, the semiconductor layer 40 having an island shape may be formed on the gate electrode 22. Alternatively, the semiconductor layer 40 may be disposed under the data line 62 and may have the linear shape extending toward an upper portion of the gate electrode 22. The semiconductor layer 40 having the linear shape may be patterned from substantially the same layer as the data line 62.

The ohmic contact layer 55 and 56 is formed on the semiconductor layer 40, and may include a material such as silicide or N+ amorphous silicon formed by implanting N+ ions into amorphous silicon at a high concentration. The ohmic contact layer 55 and 56 may enhance contact characteristics between the source and drain electrodes 65 and 66 and the semiconductor layer 40. Alternatively, when the contact characteristics between the source and drain electrodes 65 and 66 and the semiconductor layer 40 are satisfactory, the ohmic contact layer 55 and 56 may be omitted.

The ohmic contact layer 55 and 56 may have various shapes such as an island shape or a linear shape. For example, when the ohmic contact layer 55 and 56 has an island shape, the ohmic contact layer 55 and 56 is disposed under the source and drain electrodes 65 and 66. Alternatively, when the ohmic contact layer 55 and 56 has a linear shape, the ohmic contact layer 55 and 56 may extend toward a lower portion of the data line 62.

The data metal pattern 62, 65, and 66 is formed on the ohmic contact layer 55 and 56 and the first insulating layer 30. In FIG. 1, FIG. 2A, FIG. 2B, FIG. 3A, FIG. 3B, and FIG. 3C, the data metal pattern 62, 65, and 66 includes the data line 62, the source electrode 65, and the drain electrode 66.

The data line 62 is arranged along a second direction substantially perpendicular to the first direction to cross the gate line 26, and receives a data signal to provide to the source electrode 65.

The source electrode 65 is branched from the data line 62. A first end portion of the source electrode 65 is connected to the data line 62, and a second end portion of the source electrode 65 is disposed over the semiconductor layer 40 to partially overlap the semiconductor layer 40.

An end portion of the drain electrode 66 is disposed over the semiconductor layer 40 to partially overlap the semiconductor layer 40. The drain electrode 66 is spaced apart from the source electrode 65 by a predetermined distance to face the source electrode 65, and the gate electrode 22 is disposed between the drain electrode 66 and the source electrode 65.

The source and drain electrodes 65 and 66 form the TFT 15 with the above-mentioned gate electrode 22. Thus, when an appropriate voltage is applied to the gate electrode 22, an electric current flows between the source and drain electrodes 65 and 66.

The data metal pattern 62, 65, and 66 may include a single layer or a double layer having at least one of Al, Cr, Mo, Ta, and Ti. For example, the data metal pattern 62, 65, and 66 may include a chemical-resistant material such as Cr, Mo, Ta, or Ti. Alternatively, the data metal pattern 62, 65, and 66 may include a multi-layered structure having a lower layer (not shown), which may include chemical-resistant material, and an upper layer including a low-resistance material formed on the lower layer. For example, a multi-layered structure may include a double-layered structure having a lower layer of Cr and an upper layer of Al. Alternatively, the double-layered structure may have a lower layer including Al and an upper layer including Mo. The multi-layered structure may also be a triple-layered structure having a lower layer including Mo, a middle layer including Al, and an upper layer including Mo.

The second insulating layer 70 including an insulating material is formed on the data metal pattern 62, 65, and 66 and an exposed portion of the semiconductor layer 40. The second insulating layer 70 may include an inorganic material such as silicon nitride ($SiN_x$) or silicon oxide (SiOx), an organic material having good planarization characteristics and photosensitivity, or a low dielectric insulating material, such as a-Si:C:O, a-Si:O:F, etc., formed via plasma-enhanced chemical vapor deposition (PECVD). In addition, when the second insulating layer 70 includes an organic material, the second insulating layer 70 may have a double-layered structure including the lower inorganic layer and the upper organic material, so that the exposed portion of the semiconductor layer 40 between the source and drain electrodes 65 and 66 may be prevented from contacting the organic material of the second insulating layer 70. Examples of an inorganic material that may be used for the lower inorganic layer of the second insulating layer 70 include silicon nitride ($SiN_x$) and silicon oxide (SiOx). These can be used alone or in combination.

A contact hole 76 is formed through the second insulating layer 70 to expose the drain electrode 66.

The pixel electrode 82 is formed on the second insulating layer 70, and is connected to the drain electrode 66 through the contact hole 76. The pixel electrode 82 may have substantially the same shape as the pixel.

The pixel electrode 82 controls the light transmissivity of the pixel, to control light generated from a backlight assembly (not shown), so that an image may be displayed on an LCD panel. The pixel electrode 82 is connected to the drain electrode 66 through the contact hole 76. The pixel electrode 82 receives the data voltage through the drain electrode 66, and together with a common electrode formed on a common electrode display substrate, generates an electric field, so that the arrangement direction of liquid crystal molecules disposed between the pixel electrode 82 and the common electrode (not shown) may be changed.

The pixel electrode 82 may include a transparent conductive material or a reflective conductive material. Examples of the transparent conductive material that may be used for the pixel electrode 82 include indium tin oxide (ITO), indium zinc oxide (IZO), etc. Also, examples of the reflective conductive material that may be used for the pixel electrode 82 include aluminum, silver, etc. These may be used alone or in combination. As mentioned above, a voltage is applied between the pixel electrode 82 and the common electrode, so that the arrangement direction of liquid crystal molecules may be changed due to the electric field generated by the voltage. Thus, light generated from the backlight assembly passes through the LCD panel. However, when the voltage is not applied between the pixel electrode 82 and the common electrode, light may not pass through the LCD panel.

The fan-out assembly 100a and 100b includes a gate fan-out 100a and a data fan-out 100b, and the fan-out assembly 100a and 100b connects the gate line 26 and the data line 62 with a gate tape package 5 and a data tape package 6, respectively. The fan-out assembly 100a and 100b is disposed in the peripheral area surrounding the pixel area and functions as a path through which the display substrate 1 receives various signals from an external device and applies various signals to the external device. The fan-out assembly 100a and 100b may be disposed in more than one side portion of the display substrate 1.

The fan-out assembly 100a and 100b according to exemplary embodiments of the present invention generally includes the gate fan-out 100a and the data fan-out 100b. However, the gate fan-out 100a and the data fan-out 100b will be respectively described in a first exemplary embodiment. The gate fan-out 100a will be mainly described in second, third, fourth, and fifth exemplary embodiments, but the data fan-out 100b may be substantially the same as the gate fan-out 100a.

Figure 3A:
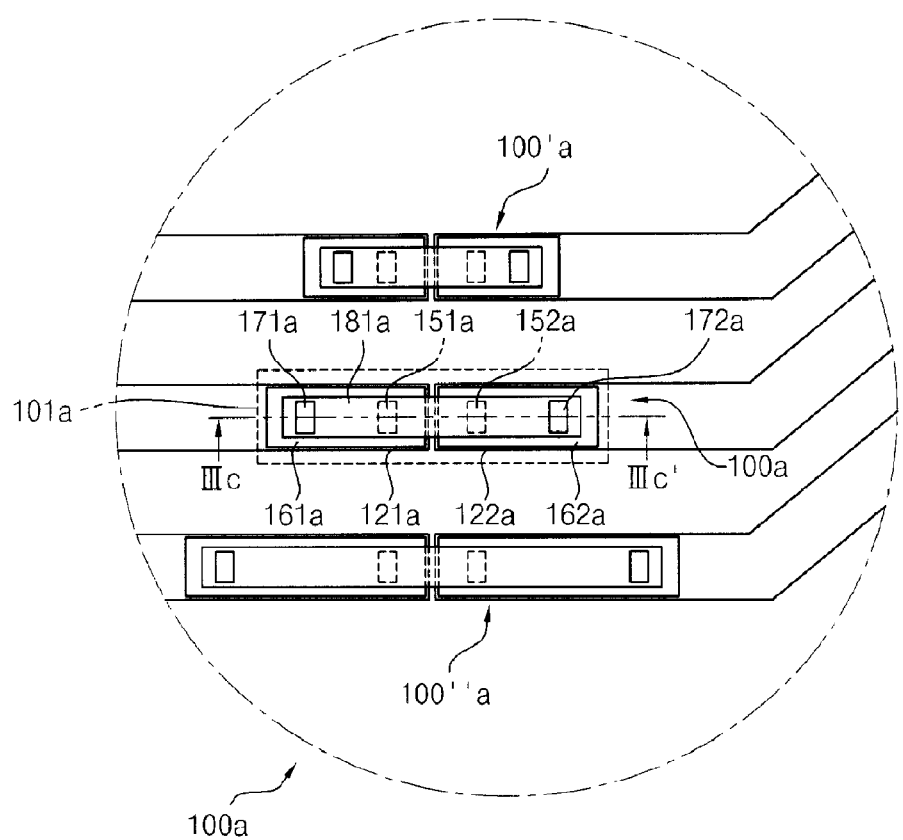
FIG. 3A is an enlarged plan view showing a portion B of FIG. 1.
Figure 3B:
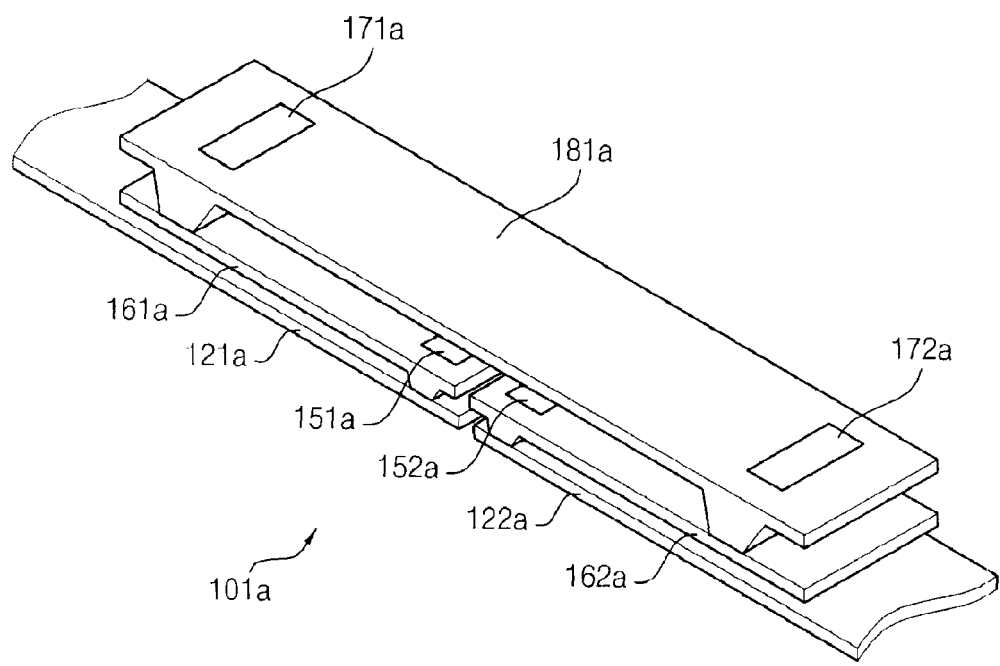
FIG. 3B is a perspective view showing the fan-out of a gate metal pattern in FIG. 3A.
Figure 3C:
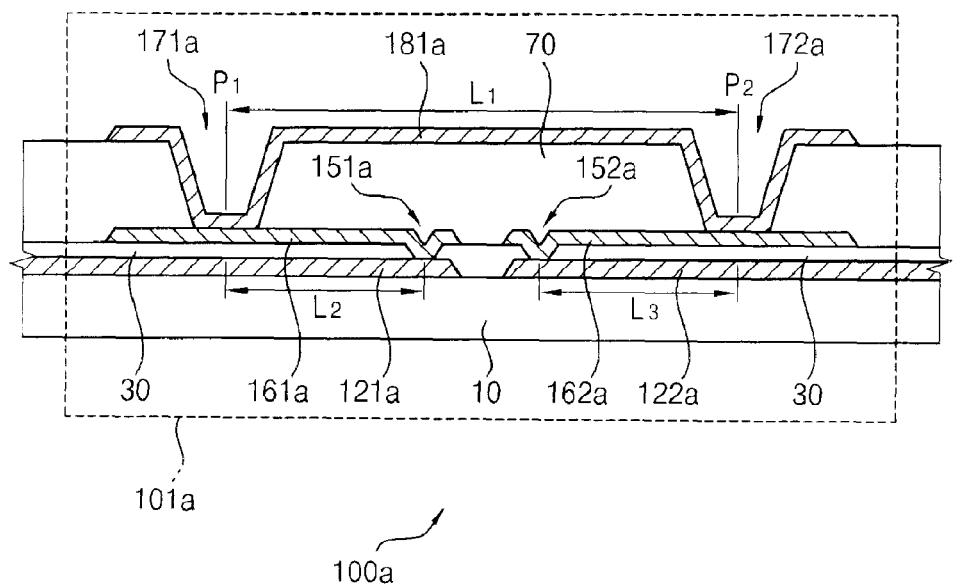
FIG. 3C is a cross-sectional view taken along line IIIc-IIIc' of FIG. 3A.

FIG. 3A is an enlarged plan view showing a portion B of FIG. 1. FIG. 3B is a perspective view showing the fan-out of a gate metal pattern in FIG. 3A. FIG. 3C is a cross-sectional view taken along a line IIIc-IIIc' of FIG. 3A.

Referring to FIG. 3A, FIG. 3B, and FIG. 3C, the gate fan-out 100a according to the present exemplary embodiment includes a resistance control portion 101a to control a resistance value, so that resistance differences caused by length differences between each channel may be compensated for. The resistance control portion 101a includes a plurality of metal layers, to increase the length of a resistance pattern in the display substrate 1 having limited space, for example, a delivery path of the gate signal. The resistance control portion 101a includes a first line 121a, a second line 122a, a resistance control pattern 181a, a first detour pattern 161a, and a second detour pattern 162a.

The first line 121a is connected to a gate pad (not shown) to receive the gate signal. The first line 121a is formed from substantially the same layer as the gate metal pattern 22 and 26, and may be simultaneously formed with the gate metal pattern 22 and 26. The first line 121a may include substantially the same material as the gate metal pattern 22 and 26. Examples of a material that can be used for the first line 121a may include Al, Ag, Cu, Mo, Cr, Ti, Ta, or an alloy thereof. These can be used alone or in combination. The first line 121a and the gate metal pattern 22 and 26 may be formed from substantially the same etching process.

The second line 122a is connected to the TFT 15 to output the gate signal to the TFT 15. The second line 122a is formed from substantially the same layer as the gate metal pattern 22 and 26 and the first line 121a, and may be simultaneously formed with the gate metal pattern 22 and 26.

As mentioned above, the first and second lines 121a and 122a may be formed from substantially the same layer as the gate metal pattern 22 and 26. Alternatively, the first and second lines 121a and 122a may be formed from substantially the same layer as the data metal pattern 62, 65, and 66. In addition, the first and second lines 121a and 122a may define directions of signal input and signal output. However, in FIG. 3A, FIG. 3B, and FIG. 3C, the first and second lines 121a and 122a respectively designate two lines forming the resistance control portion 101a regardless of the directions of signal input and signal output. Accordingly, the signal may be input through the second line 122a and output through the first line 121a.

The resistance control pattern 181a may be simultaneously formed with the pixel electrode 82. The resistance control pattern 181a is formed over the first and second lines 121a and 122a, and may include substantially the same material as the pixel electrode 82. For example, the resistance control pattern 181a may include a transparent conductive material such as ITO or IZO, or a reflective conductive material such as Al. The resistance control pattern 181a may be formed from substantially the same etching process used to form the pixel electrode 82. The resistance control pattern 181a may include substantially the same material as the pixel electrode 82, such as ITO or IZO, so that the resistance control pattern 181a may have a larger electric resistance than the gate metal pattern 22 and 26 and the data metal pattern 62, 65, and 66 when the resistance control pattern 181*a*, the gate metal pattern 22 and 26, and the data metal pattern 62, 65, and 66 have the same length. Accordingly, the length of the resistance control pattern 181*a* may be changed to easily control the resistance of the gate fan-out 100*a*.

The first and second lines 121*a* and 122*a* are connected to the resistance control pattern 181*a* through the first and second detour patterns 161*a* and 162*a*, respectively. Accordingly, the gate signal applied to the gate pad (not shown) is input to the first line 121*a* to be applied to the TFT 15 via the first detour pattern 161*a* connected to the first line 121*a*, the resistance control pattern 181*a*, the second detour pattern 162*a*, and the second line 122*a*.

The first and second detour patterns 161*a* and 162*a* may be formed from substantially the same layer as the data metal pattern 62, 65, and 66. The first and second detour patterns 161*a* and 162*a* may be simultaneously formed with the data metal pattern 62, 65, and 66. The first and second detour patterns 161*a* and 162*a* may include substantially the same material as the data metal pattern 62, 65, and 66. Examples of the material that may be used for the first and second detour patterns 161*a* and 162*a* include Al, Cr, Mo, Ta, Ti, etc. These can be used alone or in combination. The first and second detour patterns 161*a* and 162*a* may be formed from substantially the same etching process used to form the data metal pattern 62, 65, and 66.

The first and second lines 121*a* and 122*a* are formed on the insulating substrate 10, and the first line 121*a* is spaced apart from the second line 122*a* such that the first line 121*a* is insulated from the second line 122*a*. The first insulating layer 30 is formed on the first and second lines 121*a* and 122*a*, and the first and second detour patterns 161*a* and 162*a* are formed on the first insulating layer 30. The first and second detour patterns 161*a* and 162*a* are respectively formed over the first and second lines 121*a* and 122*a*. An end portion of the first detour pattern 161*a* is connected to the first line 121*a* through a contact hole 151*a*, and an end portion of the second detour pattern 162*a* is connected to the second line 122*a* through a contact hole 152*a*. The second insulating layer 70 is formed on the first and second detour patterns 161*a* and 162*a*, and the resistance control pattern 181*a* is formed on the second insulating layer 70. Opposite end portions of the resistance control pattern 181*a* are connected to the first and second detour patterns 161*a* and 162*a* through contact holes 171*a* and 172*a*, respectively.

Accordingly, the resistance control portion 101*a* includes the first line 121*a*, the second line 122*a*, the first and second detour patterns 161*a* and 162*a*, and the resistance control pattern 181*a*. Each channel G1, . . . , Gn includes a resistance control portion 101*a*, thereby forming the gate fan-out 100*a*.

A total length from a start position P1 to an end position P2 of a signal passing through the resistance control portion 101*a* is the sum of the length L2 passing through the first line 121*a*, the length L2 passing through the first detour pattern 161*a*, the length L1 passing through the resistance control pattern 181*a*, the length L3 passing through the second detour pattern 162*a*, and the length L3 passing through the second line 122*a*. Accordingly, the total length passing through the resistance control portion 101*a* is (L2)×2+L1+(L3)×2, and a total length not passing through the resistance control portion 101*a* is the length L1, so that the total length passing through the resistance control portion 101*a* is greater than that not passing through the resistance control portion 101*a* by about (L2)×2+(L3)×2.

The path length of the signal is vertically increased to control the resistance difference in the same area. The lengths L1, L2, and L3 for the gate signal passing through the resistance control pattern 181*a* and the first and second detour patterns 161*a* and 162*a* are adjusted based on the resistance differences between each channel G1, . . . , Gn, so that the resistance differences of the gate fan-out 100*a* may be controlled.

The length L1 for the signal passing through the resistance control pattern 181*a* may increase the path length of the signal. However, the resistance control pattern 181*a* may include substantially the same material as the pixel electrode 82, such as ITO or IZO, and the resistance control pattern 181*a* may have a much greater resistance than the gate metal pattern 22 and 26 or the data metal pattern 62, 65, and 66, so that controlling the length of the resistance control pattern 181*a* may allow the resistance of the fan-out 100*a* to be controlled. For example, when the total length of the resistance control portion 101*a* is controlled, the resistance increases due to the change of the length by about (L2)×2+(L3)×2 and the change of the material of the resistance control pattern 181*a*.

The first line 121*a* of the resistance control portion 101*a* extends toward the gate pad (not shown) and may be directly connected to the gate pad. Alternatively, the first line 121*a* may be connected to the gate pad via an additional line (not shown).

In addition, first and second additional detour patterns (not shown) may be formed between the resistance control pattern 181*a* and the first and second detour patterns 161*a* and 162*a*, so that the resistance control pattern 181*a* may be connected to the first and second detour patterns 161*a* and 162*a* via the first and second additional detour patterns, respectively. In this case, the first and second additional detour patterns may include substantially the same material as the first and second lines 121*a* and 122*a*.

Figure 4A:
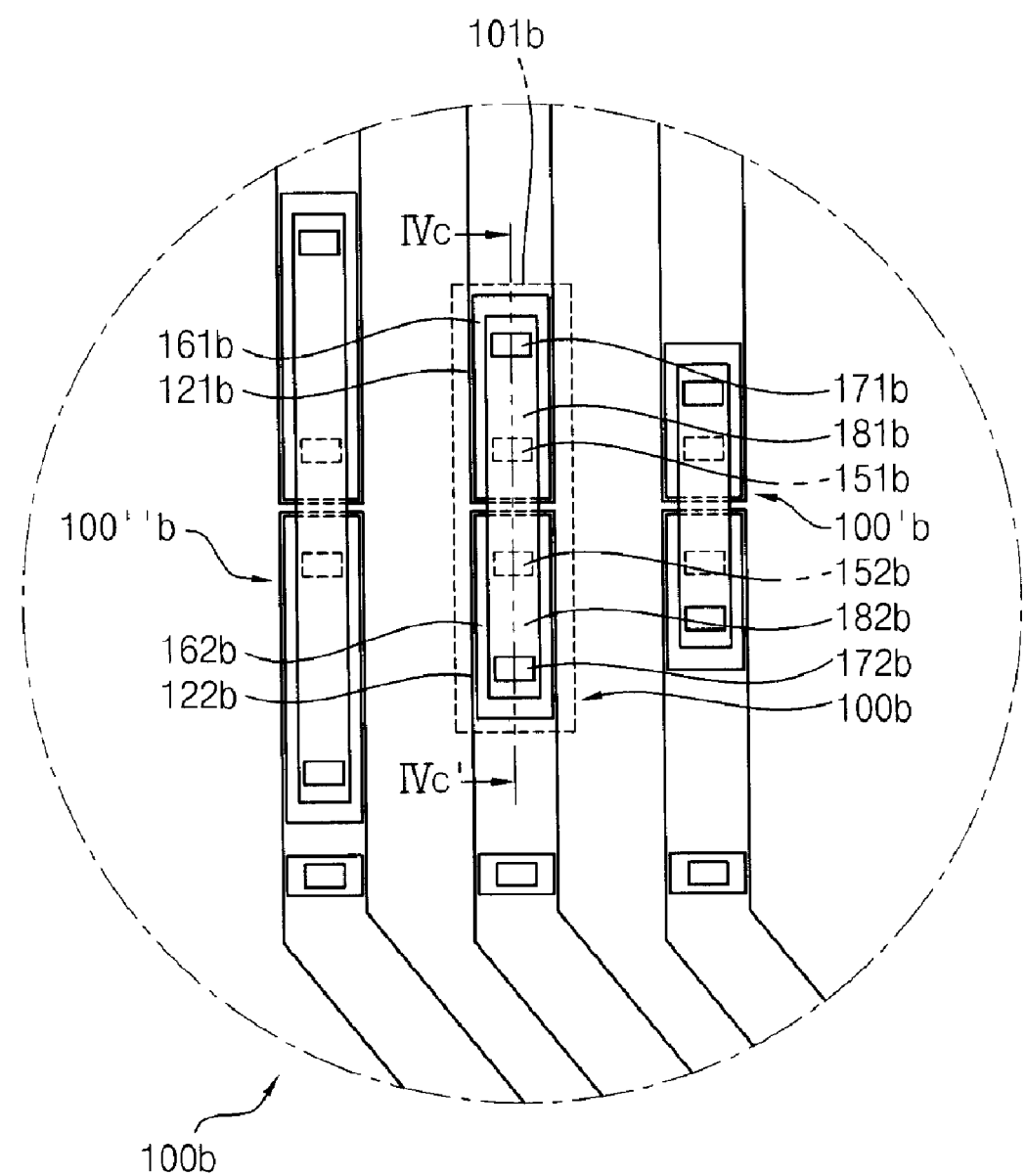
FIG. 4A is an enlarged plan view showing a portion C of FIG. 1.
Figure 4B:
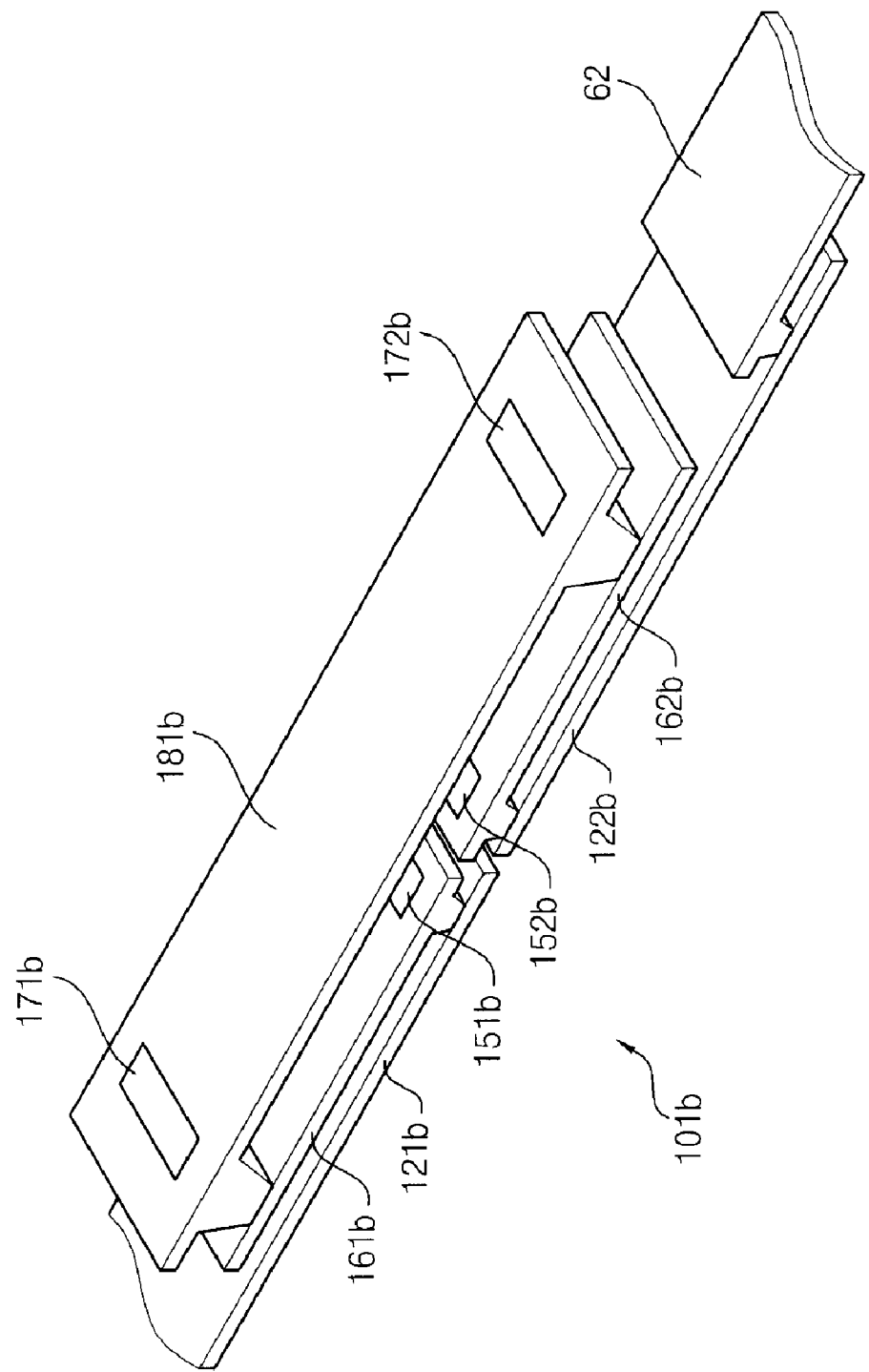
FIG. 4B is a perspective view showing the fan-out of a data metal pattern in FIG. 4A.
Figure 4C:
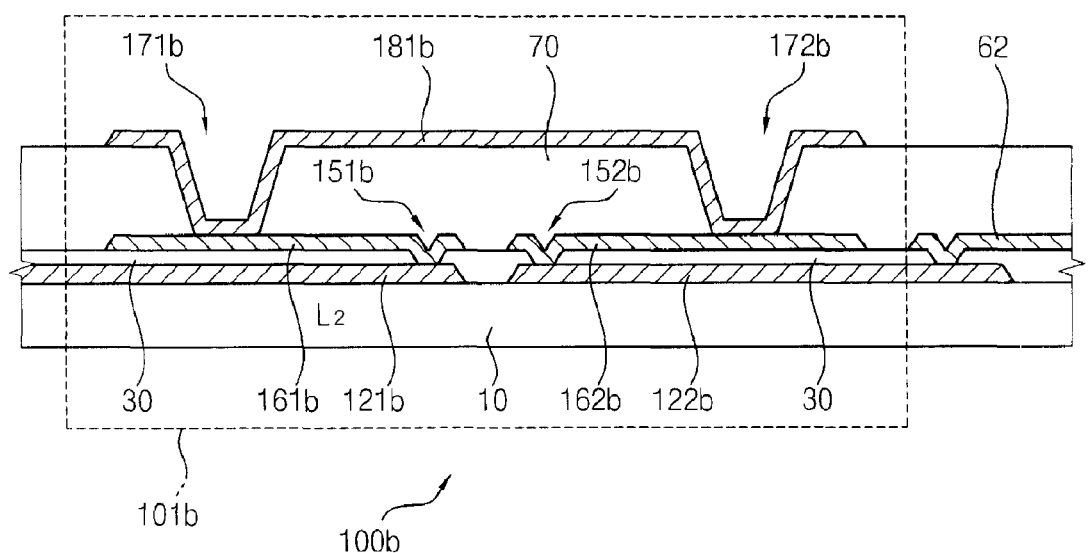
FIG. 4C is a cross-sectional view taken along line IVc-IVc' of FIG. 4A.

FIG. 4A is an enlarged plan view showing a portion C of FIG. 1. FIG. 4B is a perspective view showing the fan-out of a data metal pattern in FIG. 4A. FIG. 4C is a cross-sectional view taken along line IVc-IVc' of FIG. 4A.

Referring to FIG. 4A, FIG. 4B, and FIG. 4C, the data fan-out 100*b* includes a resistance control portion 101*b* to control the resistance differences according to the length differences between channels. The resistance control portion 101*b* includes the plurality of metal layers to enhance the length of the resistance pattern in the display substrate 1 having the limited space. For example, the resistance control portion 101*b* includes a first line 121*b*, a second line 122*b*, a resistance control pattern 181*b*, and first and second detour patterns 161*b* and 162*b*.

The data fan-out 100*b* according to the present exemplary embodiment is substantially the same as the gate fan-out 100*a* mentioned above, except for a line connected to the first and second lines 121*b* and 122*b* and a signal applied thereto. Thus, any further repetitive explanation concerning the above elements will be omitted.

The first line 121*b* is connected to a data pad (not shown) to receive a data signal. The first line 121*b* may be formed from substantially the same layer as the gate metal pattern 22 and 26, and may be formed from substantially the same metal as the gate metal pattern 22 and 26.

The second line 122*b* is connected to the TFT 15 to output the data signal to the TFT 15. The second line 122*b* may be formed from substantially the same layer as the gate metal pattern 22 and 26, and may be simultaneously formed with the gate metal pattern 22 and 26. A first portion of the second line 122*b* is connected to the second detour pattern 162*b*, and a second portion of the second line 122*b* is connected to the data line 62. For example, the second line 122*b* is simultaneously formed with the gate metal pattern 22 and 26, so that the second line 122b is connected to the data line 62 that is formed from different layer from the second line 122b, to apply the data signal to the TFT 15.

The first and second lines 121b and 122b may be formed from substantially the same layer as the gate metal pattern 22 and 26. Alternatively, the first and second lines 121b and 122b may be formed from substantially the same layer as the data metal pattern 62, 65, and 66. For example, the second line 122b may be formed from substantially the same layer as the data metal pattern 62, 65, and 66 to be integrally formed with the data line 62.

The first line 121b of the resistance control portion 101b may extend toward the data pad (not shown) and may be directly connected to the data pad. Alternatively, the first line 121b may be connected to the data pad via an additional line (not shown).

In addition, first and second additional detour patterns (not shown) may be formed between the resistance control pattern 181b and the first and second detour patterns 161b and 162b, so that the resistance control pattern 181b may be connected to the first and second detour patterns 161b and 162b via the first and second additional detour patterns.

Figure 5A:
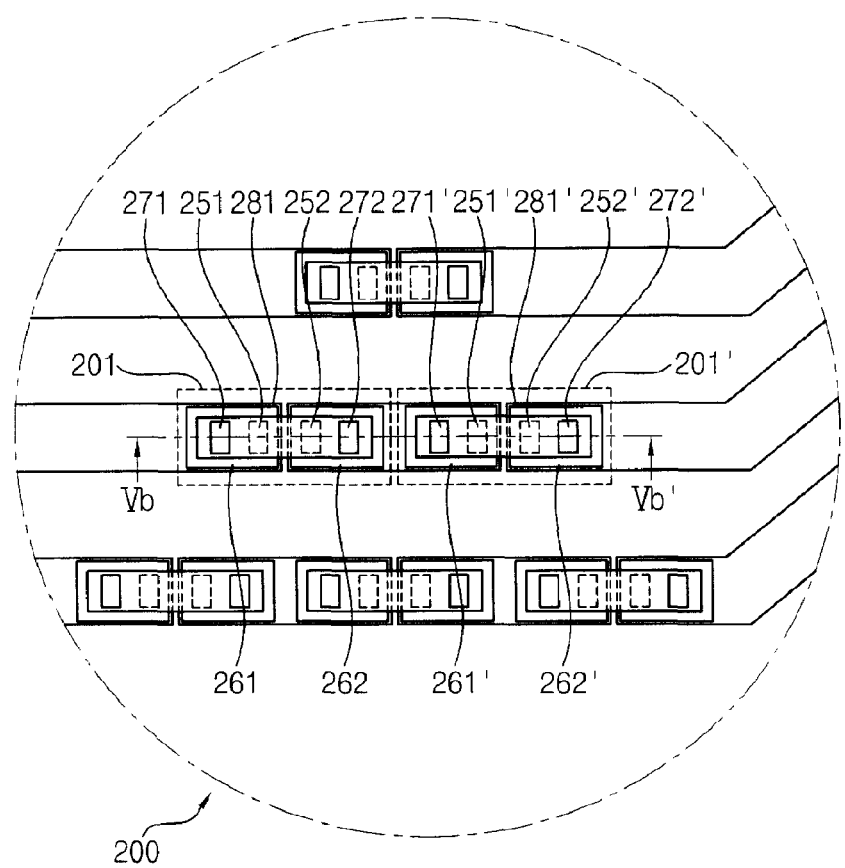
FIG. 5A is a plan view showing a fan-out having a resistance control portion according to a second exemplary embodiment of the present invention.
Figure 5B:
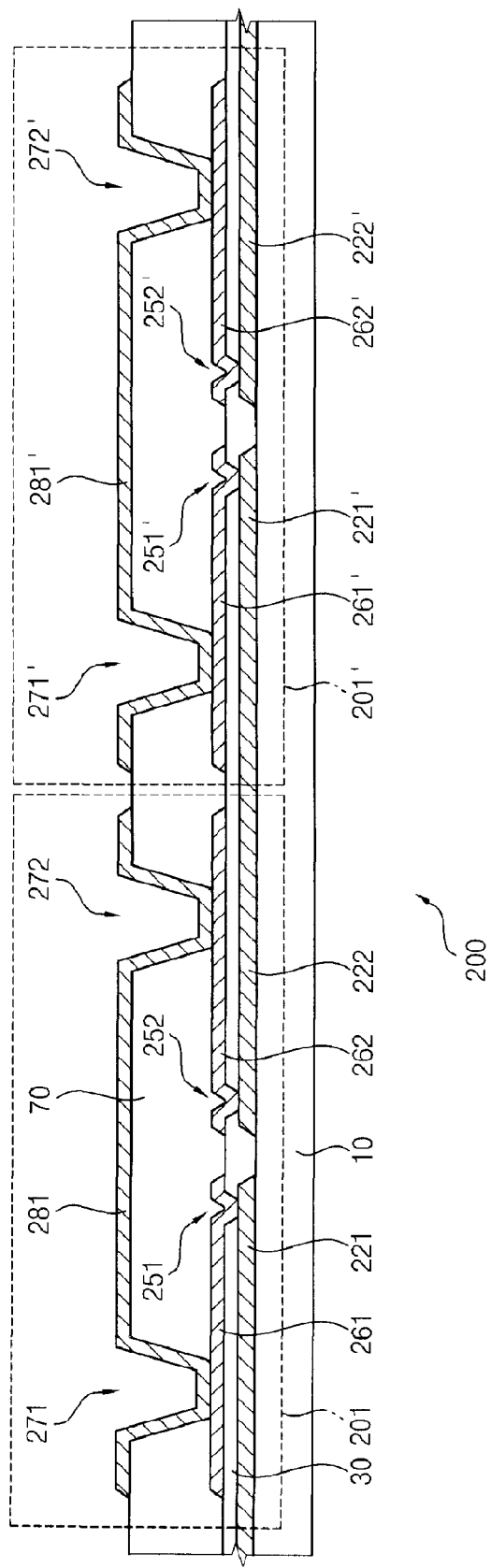
FIG. 5B is a cross-sectional view taken along line Vb-Vb' of FIG. 5A.

FIG. 5A is a plan view showing a fan-out 200 having a resistance control portion according to a second exemplary embodiment of the present invention. FIG. 5B is a cross-sectional view taken along line Vb-Vb' of FIG. 5A.

Referring to FIG. 5A and FIG. 5B, the fan-out 200 having the resistance control portion according to the present exemplary embodiment includes a plurality of resistance control portions 201 and 201' in each channel G1, . . . , Gn and D1, . . . , Dn. For example, unit resistance control portions 201 and 201' having a constant resistance are formed, and the plurality of resistance control portions 201 and 201' may be formed according to the resistance required.

The resistance control portions 201 and 201' include first lines 221 and 221', second lines 222 and 222', resistance control patterns 281 and 281', and first and second detour patterns 261, 261', 262, and 262'. The resistance control portions 201 and 201' are formed by controlling the lengths of the resistance control patterns 281 and 281' and the first and second detour patterns 261, 261', 262, and 262'. The resistance of the unit resistance control portion 201 and 201' may be changed according to the lengths of the channels G1, . . . , Gn and D1, . . . , Dn.

Figure 6A:
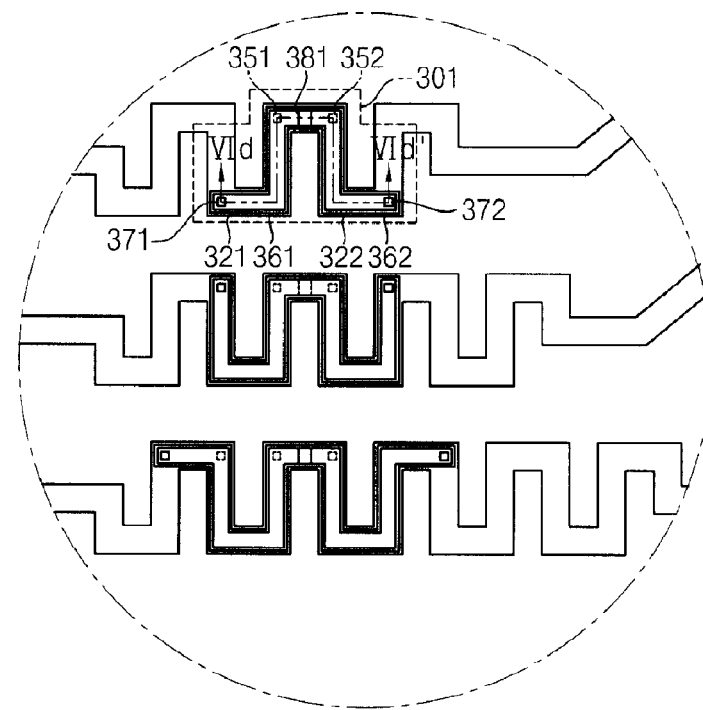
FIG. 6A is a plan view showing a fan-out having a resistance control portion according to a third exemplary embodiment of the present invention.
Figure 6B:
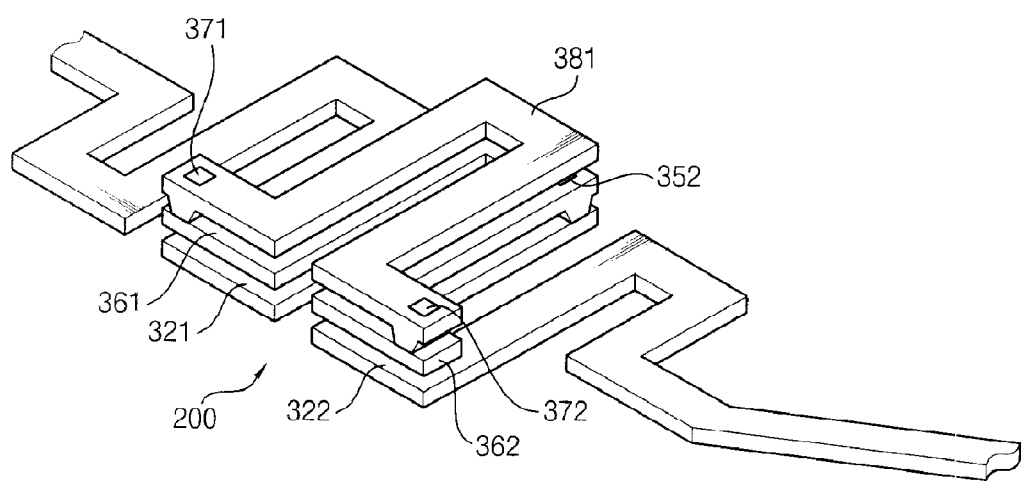
FIG. 6B is a perspective view showing the resistance control portion of FIG. 6A.
Figure 6C:
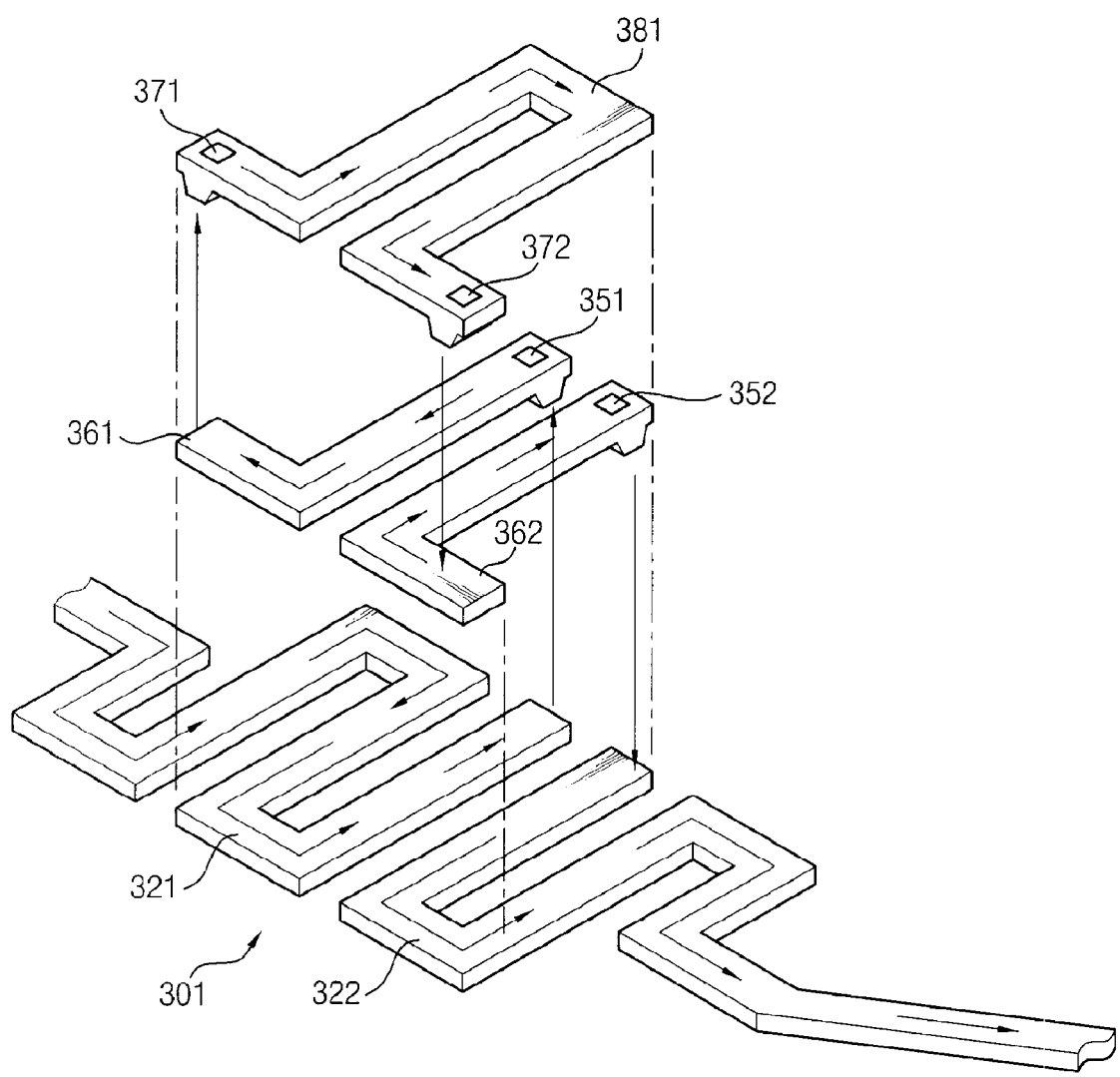
FIG. 6C is an exploded perspective view showing the resistance control portion of FIG. 6A.
Figure 6D:
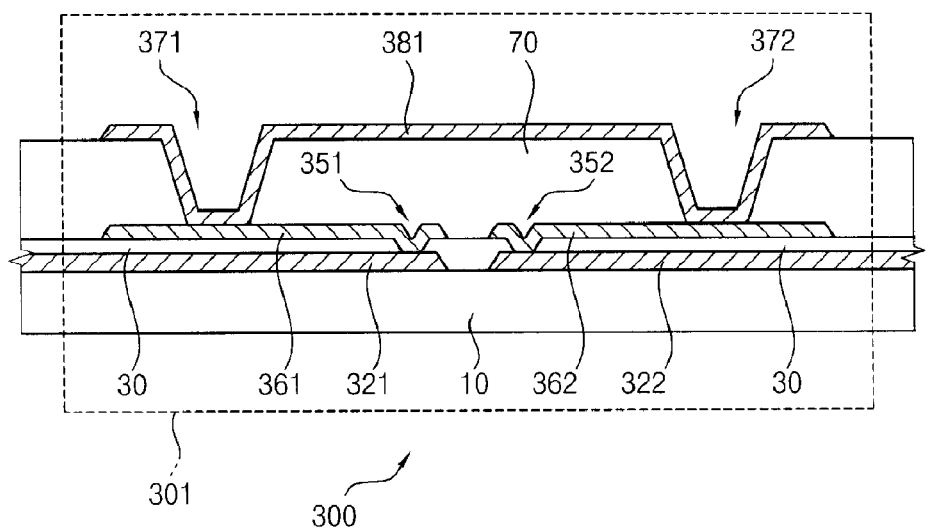
FIG. 6D is a cross-sectional view taken along line VId-VId' of FIG. 6A.

FIG. 6A is a plan view showing a fan-out 300 having a resistance control portion 301 according to a third exemplary embodiment of the present invention. FIG. 6B is a perspective view showing the resistance control portion 301 of FIG. 6A. FIG. 6C is an exploded perspective view showing the resistance control portion 301 of FIG. 6A. FIG. 6D is a cross-sectional view taken along line VId-VId' of FIG. 6A.

Referring to FIG. 6A and FIG. 6B, the fan-out 300 having the resistance control portion 301 according to the present exemplary embodiment includes the resistance control portion 301 arranged with a zigzag shape. The resistance control portion 301 includes a first line 321, a second line 322, a resistance control pattern 381, and first and second detour patterns 361 and 362.

The resistance control portion 301 may be arranged with the zigzag shape on the display substrate 1 to form the fan-out 300. The path length of a signal passing through the resistance control portion 301 arranged in the zigzag shape is greater than the path length of the signal passing through the resistance control portion arranged in a straight line, so the range in which the resistance may be controlled increases.

Referring to FIG. 6D, FIG. 3C, and FIG. 4C, a cross-sectional shape of the resistance control portion 301 according to the present exemplary embodiment is substantially the same as that of the resistance control portion 101a and 101b according to the first exemplary embodiment. For example, a method for increasing the path length of a signal according to the present exemplary embodiment is substantially the same as that according to the first exemplary embodiment, but the resistance control portion 301 according to the present exemplary embodiment is arranged with the zigzag shape, so that a margin to control the length of the resistance control portion 301 may be increased.

Referring to FIG. 6C, the gate signal or the data signal is input through the first line 321 and is output via the first detour pattern 361, the resistance control pattern 381, the second detour pattern 362, and the second line 322, sequentially. Thus, the path length of a signal, the length of the resistance control pattern 381, and the width of the resistance control pattern 381 may be changed to control the resistance of the resistance control portion 301.

Figure 7A:
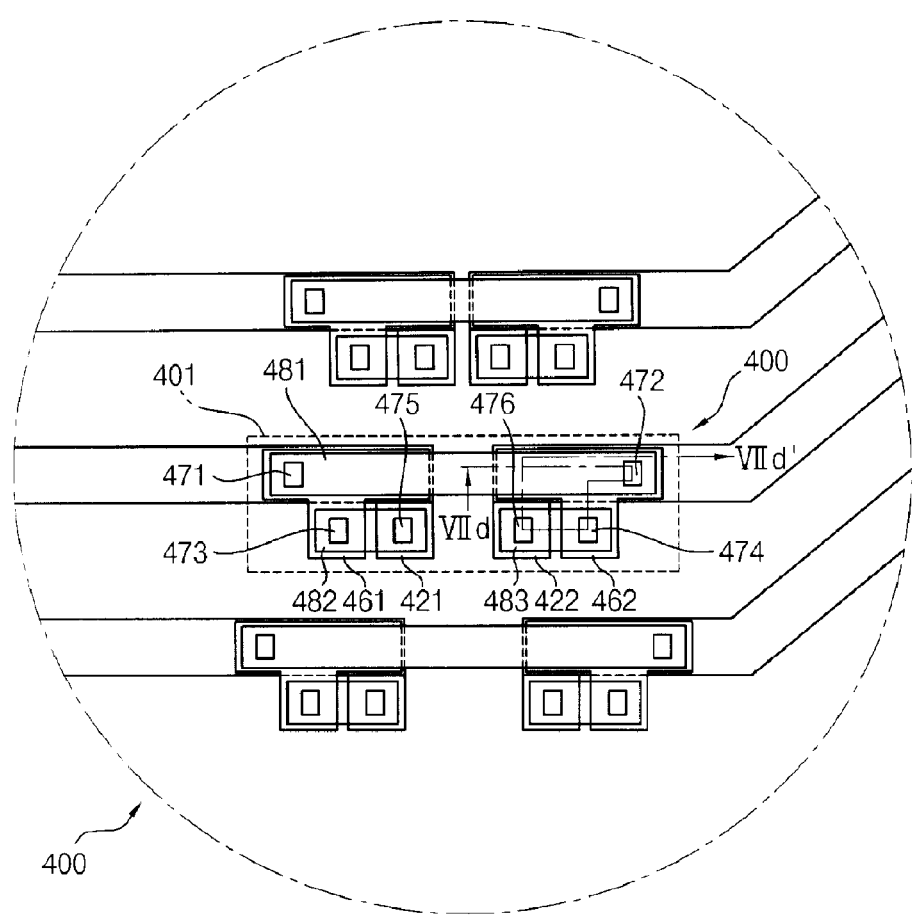
FIG. 7A is a plan view showing a fan-out having a resistance control portion according to a fourth exemplary embodiment of the present invention.
Figure 7B:
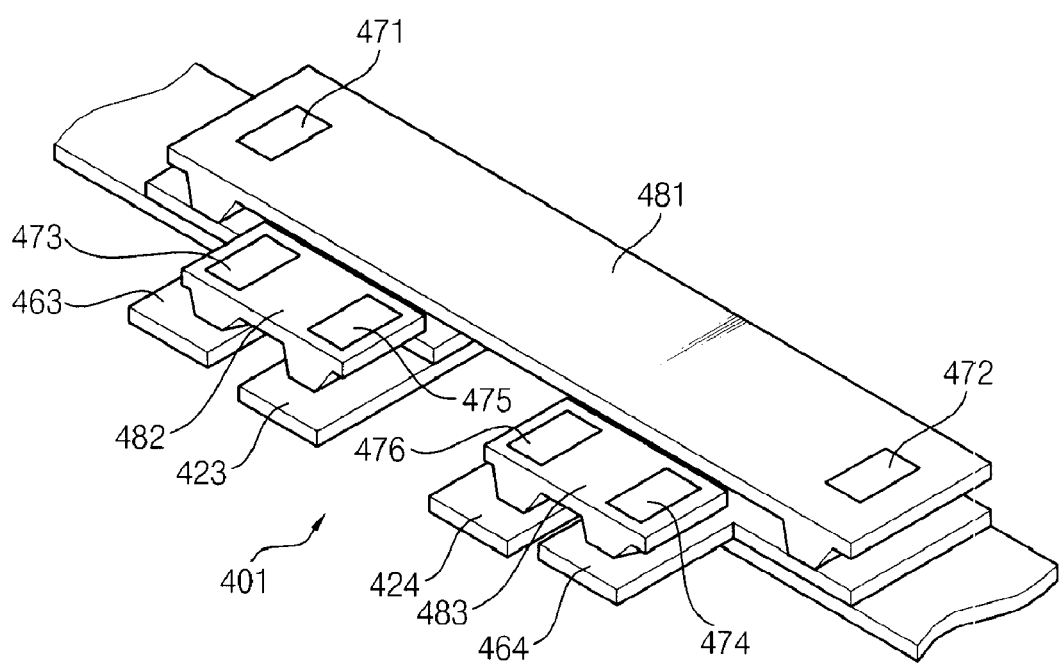
FIG. 7B is a perspective view showing the resistance control portion of FIG. 7A.
Figure 7C:
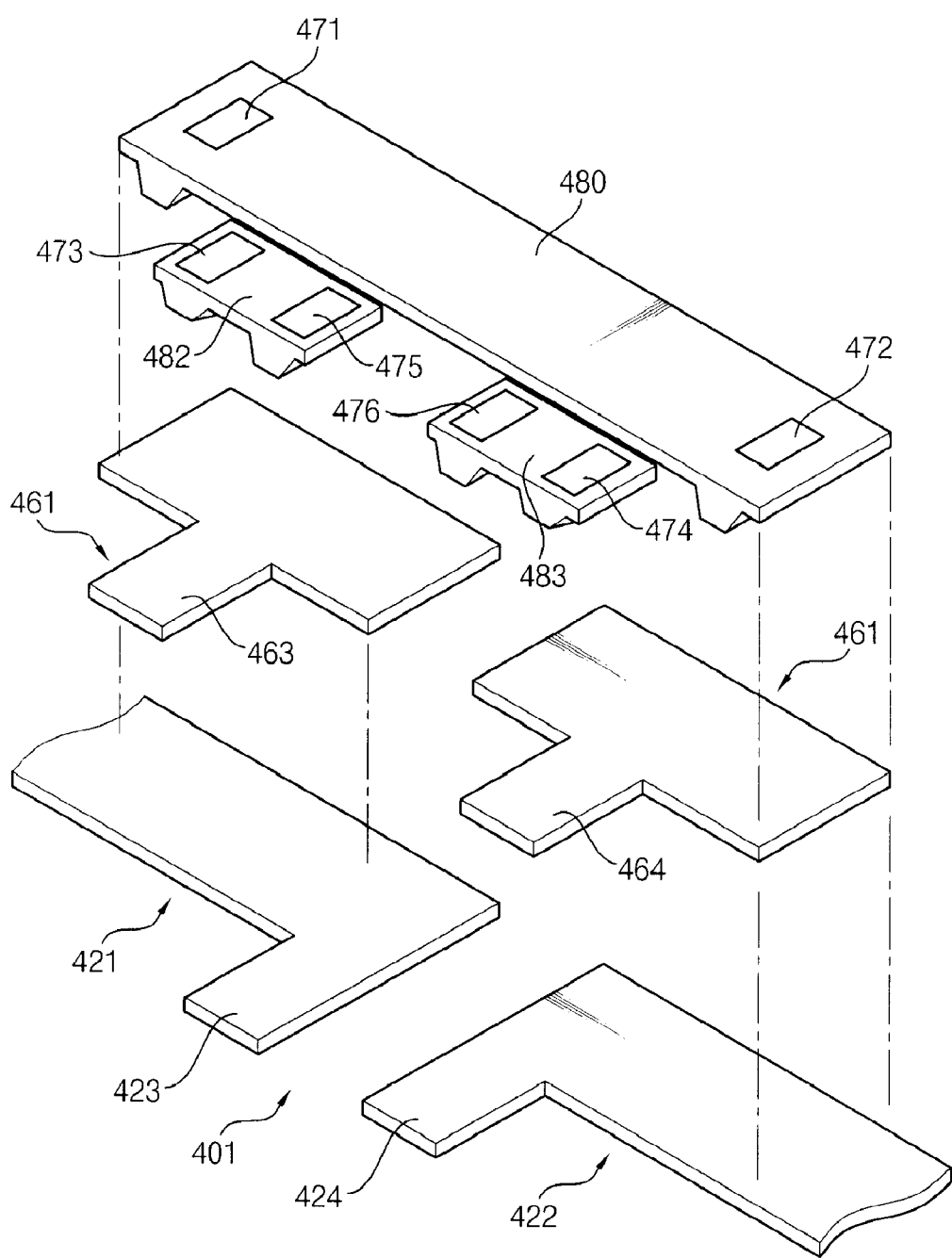
FIG. 7C is an exploded perspective view showing the resistance control portion of FIG. 7A.
Figure 7D:
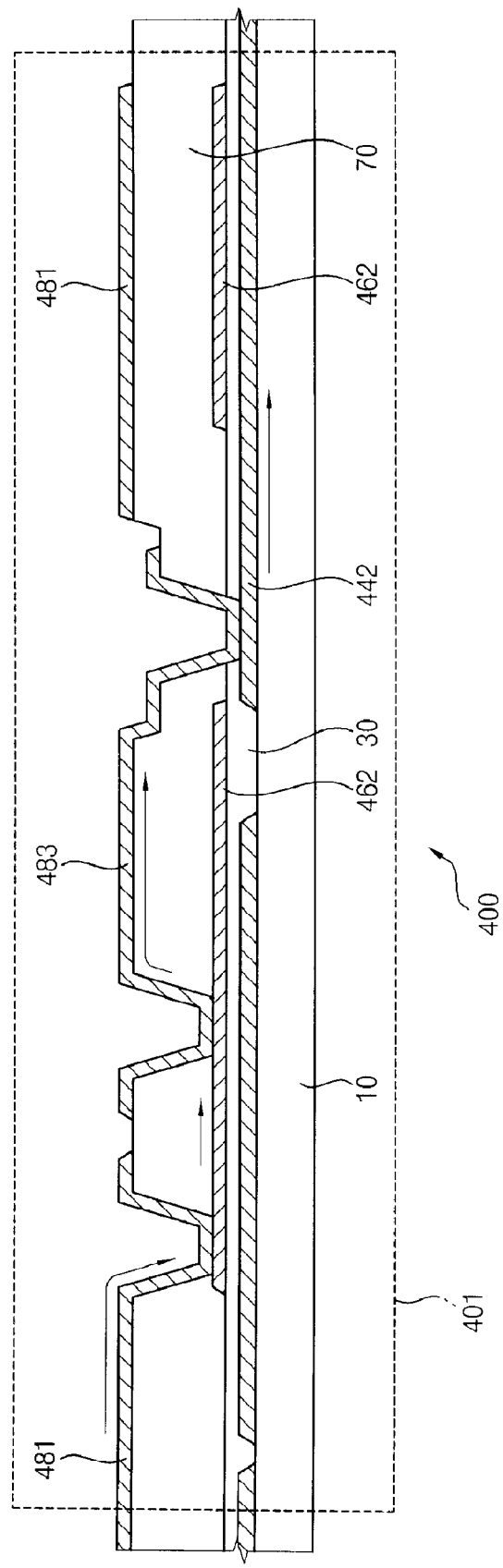
FIG. 7D is a cross-sectional view taken along line VIId-VIId' of FIG. 7A.

FIG. 7A is a plan view showing a fan-out 400 having a resistance control portion 401 according to a fourth exemplary embodiment of the present invention. FIG. 7B is a perspective view showing the resistance control portion 401 of FIG. 7A. FIG. 7C is an exploded perspective view showing the resistance control portion 401 of FIG. 7A. FIG. 7D is a cross-sectional view taken along line VIId-VIId' of FIG. 7A.

Referring to FIGS. 7A, FIG. 7B, FIG. 7C, and FIG. 7D, the fan-out 400 according to the present exemplary embodiment includes a resistance control portion 401 having first and second additional resistance control patterns 482 and 483 connecting a first line 421 and a second line 422 with first and second detour patterns 461 and 462, respectively.

An end portion of the first line 421 is connected to the gate pad (not shown) or the data pad (not shown) to receive the gate signal or the data signal. The second line 422 is connected to the TFT 15 to output a gate signal or a data signal. The first and second lines 421 and 422 include first and second extension portions 423 and 424 that extend to side surfaces of the first and second lines 421 and 422, respectively.

In addition, the first and second detour patterns 461 and 462 are formed on the first and second lines 421 and 422 and include first and second connecting portions 463 and 464 that extend from side portions of the first and second detour patterns 461 and 462, respectively. First end portions of the first and second patterns 461 and 462 are connected to the resistance control pattern 481 through contact holes 471 and 472, respectively. Second end portions of the first and second patterns 461 and 462 are connected to the first and second lines 421 and 422 via the first and second additional resistance control patterns 482 and 483, respectively.

For example, the first and second additional resistance control patterns 482 and 483 connect the first and second connecting portions 463 and 464 with the first and second extension portions 423 and 424, respectively. Accordingly, the first and second lines 421 and 422 are connected to the first and second detour patterns 461 and 462 via the first and second additional resistance control patterns 482 and 483, so that an additional mask process is not necessary to manufacture the display substrate using four or five masks. Thus, the number of the masks required to manufacture the display substrate may be decreased.

The first and second additional resistance control patterns 482 and 483 may be formed from substantially the same material as the resistance control pattern 481, such as ITO or IZO, so the lengths and widths of the first and second additional resistance control patterns 482 and 483 may be changed to control the total resistance of the resistance control portion 401.

Opposite end portions of the resistance control pattern 481 are connected to the first and second detour patterns 461 and 462 through the contact holes 471 and 472, and the length of the resistance control pattern 481 is changed to control the resistance of the resistance control portion 401.

Referring to FIG. 7B and FIG. 7D, the gate or data signals are input through the first line 421, and are output via the first additional resistance control pattern 482, the first detour pattern 461, the resistance control pattern 481, the second detour pattern 462, the second additional resistance control pattern 483, and the second line 422, sequentially. Accordingly, the path length or the lengths and widths of the first and second additional resistance control patterns 482 and 483 may be changed, which may allow the resistance of the resistance control portion 401 to be controlled.

Figure 8A:
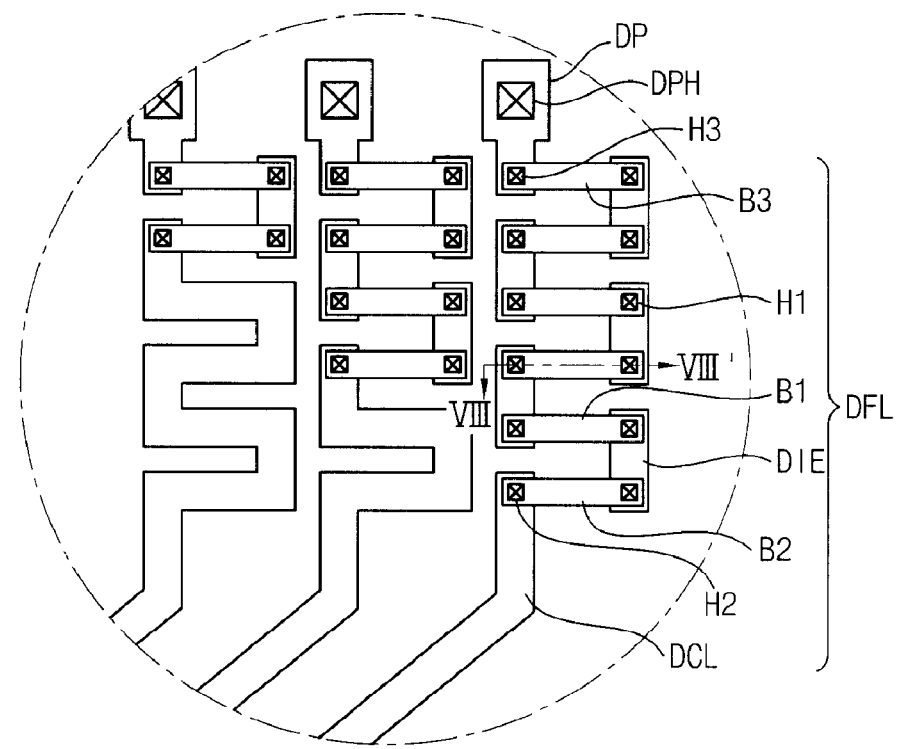
FIG. 8A is a plan view showing a data fan-out having an island portion according to a fifth exemplary embodiment of the present invention.
Figure 8B:
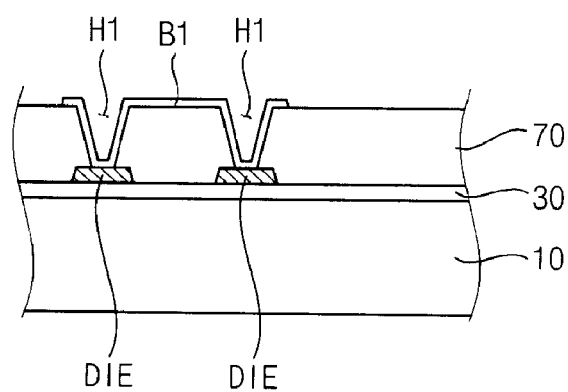
FIG. 8B is a cross-sectional view taken along line VIII-VIII' of FIG. 8A.

FIG. 8A is a plan view showing a data fan-out 500 having an island portion according to a fifth exemplary embodiment of the present invention. FIG. 8B is a cross-sectional view taken along line VIII-VIII' of FIG. 8A.

Referring to FIG. 2A, FIG. 8A, and FIG. 8B, the data fan-out having an island portion according to the present exemplary embodiment includes data fan-out lines DFL having a data connecting line DCL, a plurality of data island portions DIE, at least one first bridge portion B1, a second bridge portion B2, and a third bridge portion B3. The data connecting line DCL extends from the data line 62 adjacent to the data pad DP. The data island portions DIE are disposed between the data connecting lines DCL and the data pads DP. The first bridge portion B1 may be formed from a different layer than the data island portion DIE. The second and third bridge portions B2 and B3 may be formed from substantially the same layer as the first bridge portion B1.

Each data fan-out line DFL may be patterned by the data island portion DIE and the first, second, and third bridge portions B1, B2, and B3. In addition, the number of repeated zigzag patterns of the data fan-out lines DFL increases as a straight distance between a data line 62 and a corresponding data pad DP decreases.

For example, the data connecting line DCL and the data island portion DIE may be formed from substantially the same layer as the data line 62 and may have a data metal pattern. The first, second, and third bridges B1, B2, and B3 may be formed from substantially the same layer as the pixel electrode 82.

Accordingly, the second insulating layer 70 is formed between the data island portion DIE and the first bridge portion B1.

Alternatively, the data island portion DIE may be formed from substantially the same layer as the gate line 26 and may form a gate metal pattern. In addition, when the data island portion DIE is formed from substantially the same layer as the gate line 26, the first and second insulating layers 30 and 70 are formed between the data island portion DIE and the first bridge portion B1.

A first hole H1, a second hole H2, a data pad hole DPH, and a third hole H3 are formed in the second insulating layer 70. The first hole H1 exposes opposite end portions of the data island portion DIE. The second hole H2 exposes an end portion of the data connecting line DCL. The data pad hole DPH exposes the data pad DP. The third hole H3 exposes an end portion of the data pad DP and is spaced from the data pad hole DPH exposing the data pad DP.

The first bridge portion B1 contacts the data island portions DIE adjacent to each other through the first hole H1. Thus, the data island portions DIE spaced apart from each other are connected to each other to be one conductive line.

The second bridge portion B2 contacts the data connecting line DCL and the island portion DIE adjacent to the data connecting line DCL through the second hole H2 exposing the data connecting line DCL and the first hole H1 exposing the data island portion DIE. Thus, the data connecting line DCL and the data island portion DIE adjacent to the data connecting line DCL are connected to each other.

The third bridge portion B3 contacts the data pad DP and the data island portion DIE adjacent to the data pad DP, through a third hole H3 exposing the data pad DP and the first hole H1 exposing the data island portion DIE. Thus, the data pad DP and the data island portion DIE adjacent to the data pad DP are connected to each other.

Accordingly, the data fan-out line DFL is formed and connects the data line 62 with the data pad DP.

In this case, the number of data island portions DIE forming each data fan-out line DFL is different from that of the first bridge portions B1. The number of the first bridge portions B1 and the data island portions DIE increases as a straight distance between a data line 62 and a corresponding data pad DP decreases.

The first bridge portion B1 and the data island portion DIE contact each other through the first hole H1 as mentioned above, so that a contact resistance applied to the data fan-out line DFL increases as the number of the first bridge portions B1 increases.

According to the present exemplary embodiment, the number of the first bridge portions B1, or the contact area between the first bridge portion B1 and the data island portion DIE may be changed to control the contact resistance applied to each data fan-out line DFL. Thus, the resistance differences due to the length differences between the data fan-out lines DFL may be compensated for by adding or subtracting the contact resistance mentioned above.

For example, the resistance differences applied to the fan-out lines may be decreased by forming the bridge portion together with the zigzag pattern when the fan-out is formed in a small space.

The data island portions are formed substantially perpendicular to the first, second, and third bridge portions in the present exemplary embodiment. Alternatively, the data island portions and the first, second, and third bridge portions may have various shapes.

Although the present exemplary embodiment has discussed the data fan-out, a gate fan-out may also have substantially the same structure as the data fan-out.

Figure 8C:
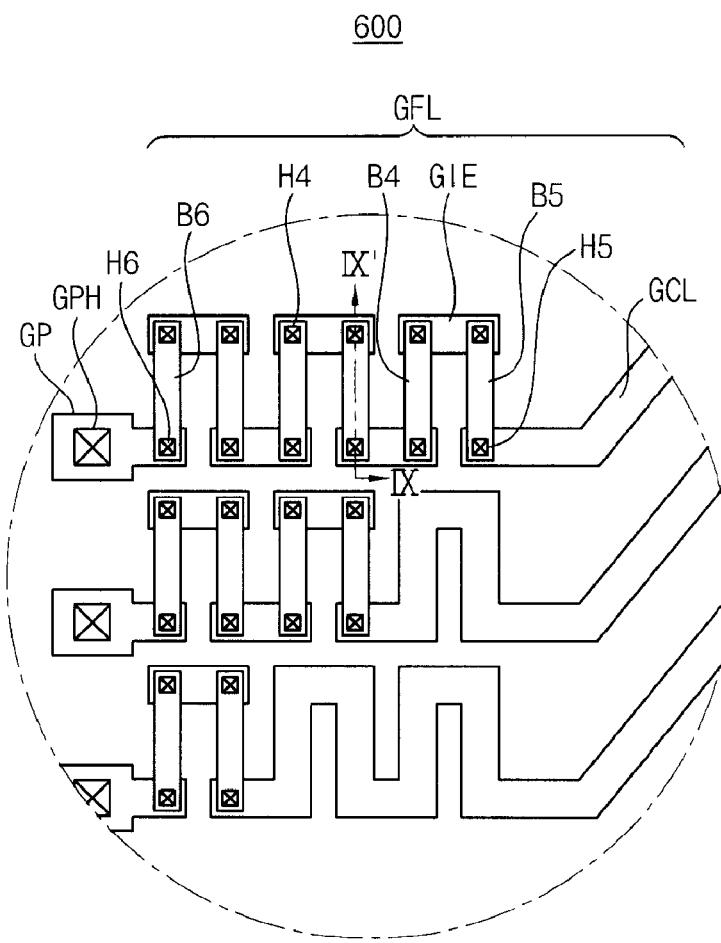
FIG. 8C is a plan view showing a gate fan-out having an island portion according to the fifth exemplary embodiment of the present invention.
Figure 8D:
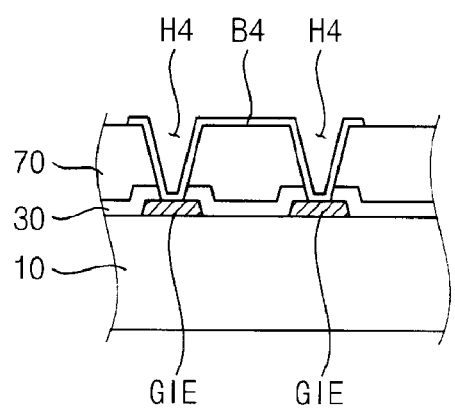
FIG. 8D is a cross-sectional view taken along line IX-IX' of FIG. 8C.

FIG. 8C is a plan view showing a gate fan-out 600 having an island portion according to the fifth exemplary embodiment of the present invention. FIG. 8D is a cross-sectional view taken along line IX-IX' of FIG. 8C.

Referring to FIG. 8C and FIG. 8D, the gate fan-out 600 includes gate fan-out lines GFL having a gate connecting line GCL, a plurality of gate island portions GIE, at least one fourth bridge portion B4, a fifth bridge portion B5, and a sixth bridge portion B6. The gate connecting line GCL extends from the gate line 26 adjacent to a gate pad GP. The gate island portions GIE are disposed between the gate connecting line GCL and the gate pads GP. The fourth bridge portion B4 may be formed from a different layer than the gate island portion GIE. The fifth and sixth bridge portions B5 and B6 may be formed from substantially the same layer as the fourth bridge portion B4.

The gate connecting line GCL and the gate island portion GIE may be formed from substantially the same layer as the gate line 26 and may have the gate metal pattern. Alternatively, the gate island portion GIE may be formed from substantially the same layer as the data line 62 and may have the data metal pattern.

In this case, the shape of the gate fan-out line GFL may be substantially the same as that of the data fan-out line DFL, except that the gate connecting line GCL, and the gate island portion GIE may be formed from the gate metal pattern in the gate fan-out line GFL.

For example, each gate fan-out line GFL is patterned to have the zigzag pattern by the gate island portion GIE and the fourth, fifth, and sixth bridge portions B4, B5, and B6. In addition, the number of the repeated zigzag patterns of the gate fan-out lines GFL increases as a straight distance between the gate line 26 and a corresponding gate pad GP decreases.

For example, the gate connecting line GCL and the gate island portion GIE may be formed from substantially the same layer as the gate line 26. The fourth, fifth, and sixth bridge portions B4, B5, and B6 may be formed from substantially the same layer as the pixel electrode 82. Accordingly, the first and second insulating layers 30 and 70 are formed between the gate island portion GIE and the fourth bridge portion B4.

Fourth, fifth, and sixth holes H4, H5, and H6, and a gate pad hole GPH are formed in the first and second insulating layers 30 and 70. The fourth hole H4 exposes opposite end portions of the gate island portion GIE. The fifth hole H5 exposes an end portion of the gate connecting line GCL. The gate pad hole GPH exposes the gate pad GP. The sixth hole H6 exposes an end portion of the gate pad GP and is spaced apart from the gate pad hole GPH.

The fourth bridge portion B4 contacts the gate island portions GIE adjacent to each other through the fourth hole H4. Thus, the gate island portions GIE spaced apart from each other are connected to each other, thereby forming one conductive line.

The fifth bridge portion B5 contacts the gate connecting line GCL and the gate island portion GIE adjacent to the gate connecting line GCL through the fifth hole H5 exposing the gate connecting line GCL and the fourth hole H4 exposing the gate island portion GIE. Thus, the gate connecting line GCL and the gate island portion GIE adjacent to the gate connecting line GCL are connected to each other.

The sixth bridge portion B6 contacts with the gate pad GP and the gate island portion GIE adjacent to the gate pad GP through the sixth hole H6 exposing the gate pad GP and the fourth hole H4 exposing the gate island portion GIE. Thus, the gate pad GP and the gate island portion GIE adjacent to the gate pad GP are connected to each other.

Accordingly, the gate fan-out line GFL connects the gate line 26 with the gate pad GP.

In this case, the number of the gate island portions GIE forming each gate fan-out line GFL is different from that of the fourth bridge portion B4. The number of fourth bridges B4 and gate island portions GIE increases as a straight distance between a gate line 26 and a corresponding gate pad GP decreases.

The fourth bridge portion B4 and the gate island portion GIE contact each other through the fourth hole H4, so that the contact resistance applied to the gate fan-out line GFL increases as the number of the fourth bridges B4 increases.

According to the present exemplary embodiment, the number of the fourth bridge portions B4, or the contact area between the fourth bridge portion B4 and the gate island portion GIE, may be changed to control the contact resistance of each gate fan-out line GFL. Thus, resistance differences caused by the length differences between the gate fan-out lines GFL may be compensated for by adding or subtracting the contact resistance mentioned above.

Figure 9:
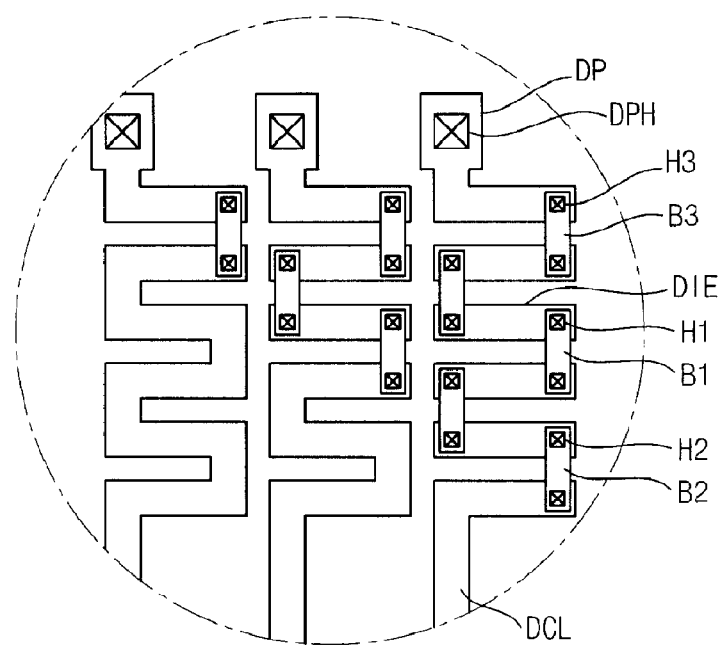
FIG. 9 is a plan view showing a data fan-out having an island portion according to a sixth exemplary embodiment of the present invention.

FIG. 9 is a plan view showing a data fan-out 700 having an island portion according to a sixth exemplary embodiment of the present invention. In the present exemplary embodiment, the same reference numerals will be used to refer to the same or like parts as those described in the fifth exemplary embodiment, and any further repetitive explanation concerning the above elements will be omitted.

Referring to FIG. 8A and FIG. 9, when the present exemplary embodiment is compared with the fifth exemplary embodiment, the data island portions DIE and the first, second, and third bridge portions B1, B2, and B3 are formed in directions that are switched from those in the fifth exemplary embodiment.

Figure 10:
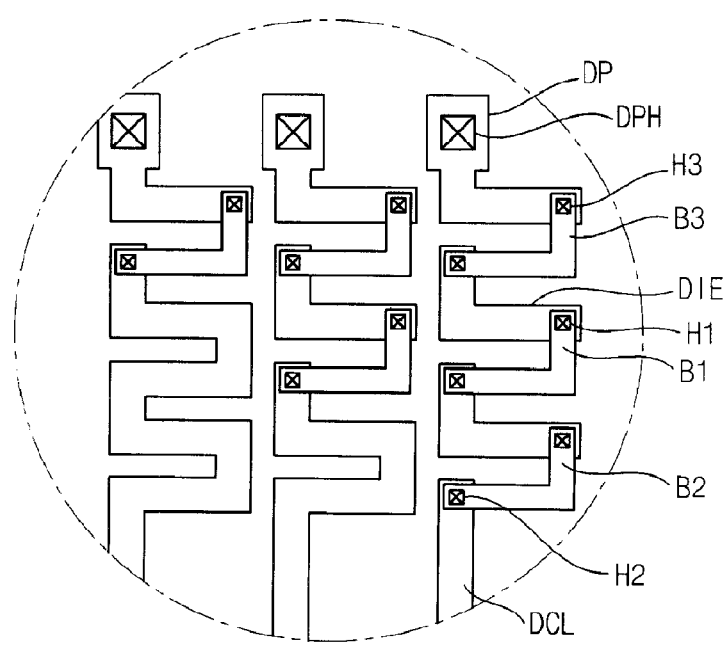
FIG. 10 is a plan view showing a data fan-out having an island portion according to a seventh exemplary embodiment of the present invention.

FIG. 10 is a plan view showing a data fan-out 800 having an island portion according to a seventh exemplary embodiment of the present invention. In the present exemplary embodiment, the same reference numerals will be used to refer to the same or like parts as those described in the fifth exemplary embodiment, and any further repetitive explanation concerning the above elements will be omitted.

Referring to FIG. 8A and FIG. 10, when the present exemplary embodiment is compared with the fifth example exemplary, the data island portions DIE and the first, second, and third bridge portions B1, B2, and B3 may have a shape including more than two edges.

Alternatively, though not shown in the figures, the island portions DIE and the first, second, and third bridge portions B1, B2, and B3 may have a curved shape.

Although the sixth and seventh exemplary embodiments have discussed the data fan-out, a gate fan-out may also have substantially the same structure as the data fan-out.

Referring again to FIG. 2A, FIG. 2B, and FIG. 3C, a method for manufacturing the display substrate according to an exemplary embodiment of the present invention will be described.

Firstly, the gate metal pattern 22 and 26 including the gate line 26, the gate electrode 22 and the maintenance electrode 29 is formed on the insulating substrate 10. For example, the first and second lines 121a and 122a may be simultaneously formed with the gate metal pattern 22 and 26.

After forming the first insulating layer 30, the contact holes 151a and 152a are formed through the first insulating layer 30 so that the first and second lines 121a and 122a may be connected to the first and second detour patterns 161a and 162a, respectively.

The semiconductor layer 40 and the ohmic contact layer 55 and 56 are formed on the first insulating layer 30, and are patterned to overlap the gate electrode 22 via a photolithography process.

The data metal pattern 62, 65, and 66, and the first and second detour patterns 161a and 162a are formed on the semiconductor layer 40 and the ohmic contact layer 55 and 56 via a sputtering process. The data metal pattern 62, 65, and 66 includes the data line 62 crossing the gate line 26, the source electrode 65 connected to the data line 62 to extend toward an upper portion of the gate electrode 22, the drain electrode 66 spaced apart from the source electrode 65 to face the source electrode 65 with respect to the gate electrode 22, and a drain electrode extension portion 67 having a large area and being extended from the drain electrode 66 to overlap the maintenance electrode 29.

The amorphous silicon layer doped with dopants that is not blocked by the data metal pattern 62, 65, and 66 is etched, to separate the data metal pattern 62, 65, and 66 into opposite sides with respect to the gate electrode 22 and to partially expose the semiconductor layer 40 between the ohmic contact layers 55 and 56. For example, the exposed surface of the semiconductor layer 40 may be stabilized via an oxide plasma process.

An organic material having good planarization characteristics and photosensitivity, a low dielectric insulating material, such as a-Si:C:O, a-Si:O:F, etc., formed via PECVD, or an inorganic material including silicon nitride ($SiN_x$) may be formed to be a single layer or a plurality of layers, thereby forming the second insulating layer 70.

The first and second insulating layers 30 and 70 are patterned via the photolithography process, to form the contact hole 76 exposing the drain electrode extension portion 67 and the contact holes 171a and 172a exposing the first and second detour patterns 161a and 162a, respectively. For example, when an organic material having photosensitivity is used, the contact hole may be formed only via the photolithography process, and the first and second insulating layers 30 and 70 may be formed via etching conditions having substantially the same etching ratio.

The ITO layer is deposited and may be etched via the photolithography process, to form the pixel electrode 82 and the resistant control pattern 181a.

Referring to FIG. 2A, FIG. 2B, FIG. 7A, FIG. 7B, FIG. 7C, and FIG. 7D, a method for manufacturing the display substrate according to another exemplary embodiment of the present invention will be described.

The method for manufacturing the display substrate according to the present exemplary embodiment includes forming the fan-out 400 without any additional mask process in the process using four or five masks.

Firstly, the gate metal pattern 22 and 26 including the gate line 26, the gate electrode 22, and the maintenance electrode 29 is formed on the insulating substrate 10. For example, the first and second lines 421 and 422 may be simultaneously formed with the gate metal pattern 22 and 26.

The first insulating layer 30 is formed on the gate metal pattern 22 and 26, the first line 421, and the second line 422.

The semiconductor layer 40 and the ohmic contact layer 55 and 56 are sequentially formed on the first insulating layer 30, and may be patterned to overlap the gate electrode 22 via the photolithography process.

The data metal pattern 62, 65, and 66, and the first and second detour patterns 461 and 462 may be formed on the semiconductor layer 40 and the ohmic contact layer 55 and 56 via a sputtering process. The data metal pattern 62, 65, and 66 includes the data line 62 crossing the gate line 26, the source electrode 65 connected to the data line 62 and extending toward the upper portion of the gate electrode 22, the drain electrode 66 spaced apart from the source electrode 65 to face the source electrode 65 with respect to the gate electrode 22, and the drain electrode extension portion 67 extending from the drain electrode 66 to overlap the maintenance electrode 29.

The portion of the amorphous silicon layer doped with dopants that is not blocked by the data metal pattern 62, 65, and 66 may be etched to separate the data metal pattern 62, 65, and 66 into opposite sides with respect to the gate electrode 22 and to partially expose the semiconductor layer 40 between the ohmic contact layers 55 and 56. For example, the exposed surface of the semiconductor layer 40 may be stabilized via the oxide plasma process.

An organic material having good planarization characteristics and photosensitivity, a low dielectric insulating material such as a-Si:C:O, a-Si:O:F, etc., formed via PECVD, or an inorganic material having silicon nitride ($SiN_x$) may be formed to be a single layer or a plurality of layers, thereby forming the second insulating layer 70.

The second insulating layer 70 may be patterned via a photolithography process to form the contact hole 76 exposing the drain electrode extension portion 67, the contact holes 471 and 472 connecting the resistance control pattern 481 with the first and second detour patterns 461 and 462, respectively, and the contact holes 473 and 474 connecting the first and second additional resistance control patterns 482 and 483 with the first and second detour patterns 461 and 462, respectively.

In addition, the contact holes 475 and 476 may be simultaneously formed in the first and second insulating layers 30 and 70 to connect the first and second detour patterns 461 and 462 with the first and second lines 421 and 422, respectively.

The ITO layer is deposited and may be etched via a photolithography process to form the pixel electrode 82, the resistance control pattern 481, and the first and second additional resistance control patterns 482 and 483.

Referring to FIG. 2A, FIG. 2B, FIG. 8A, FIG. 8B, FIG. 8C, and FIG. 8D, a method for manufacturing the display substrate according to still another exemplary embodiment of the present invention will be described.

Firstly, a gate metal pattern including a gate line 26, a gate electrode 22, a maintenance electrode 29, a gate connecting line GCL extending from the gate line 26 to be adjacent to a gate pad GP, and a gate island portion GIE is formed on the first insulating substrate 10. A first insulating layer 30 is formed on the gate metal pattern.

A semiconductor layer 40 and an ohmic contact layer 55 and 56 are formed on the first insulating layer 30 to overlap the gate electrode 22.

The data metal pattern including the data line 62, the source electrode 65 connected to the data line 62 and extending to the upper portion of the gate electrode 22, the drain electrode 66 spaced apart from the source electrode 65 to face the source electrode 65 with respect to the gate electrode 22, the drain electrode extension portion 67 extending from the drain electrode 66 to overlap the maintenance electrode 29, the data connecting line DCL extending from the data line 62 in the direction of the data pad DP, and the data island portion DIE, may be formed on the semiconductor layer 40 and the ohmic contact layer 55 and 56 via the sputtering process.

The portion of the ohmic contact layer 56 that is not blocked by the data metal pattern may be etched to expose the semiconductor layer 40 that is disposed between the source and drain electrodes 65 and 66. For example, the exposed semiconductor layer 40 may be stabilized via the oxide plasma process.

The organic material having good planarization characteristics and photosensitivity, the low dielectric insulating material such as a-Si:C:O, a-Si:O:F, etc., formed via PECVD, or the inorganic material having silicon nitride ($SiN_x$) may be formed to be a single layer or a plurality of layers, thereby forming the second insulating layer 70.

The second insulating layer 70 may be patterned via a photolithography process, to form a contact hole 76 exposing the drain electrode extension portion 67, a first hole H1 exposing both end portions of the data island portions DIE, a second hole H2 exposing the end portion of the data connecting line DCL, a data pad hole DPH exposing the data pad DP, and a third hole H3 exposing the end portion of the data pad DP separately from the data pad hole DPH.

In addition, the first and second insulating layers 30 and 70 may be patterned at the same time to form the fourth hole H4 exposing both end portions of the gate island portions GIE, the fifth hole H5 exposing the end portion of the gate connecting line GCL, the gate pad hole GPH exposing the gate pad GP, and the sixth hole H6 exposing the end portion of the gate pad GP spaced apart from the gate pad hole GPH.

The ITO layer is deposited and may be etched via a photolithography process, to form a pixel electrode 82, a first bridge portion B1, a second bridge portion B2, a third bridge portion B3, a fourth bridge portion B4, a fifth bridge portion B5, and a sixth bridge portion B6.

According to exemplary embodiments of the present invention, although the space for forming the fan-out may not be sufficient, the resistance differences between each channel of the fan-out may be compensated for.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A fan-out, comprising:
an insulating substrate;
a first line disposed on the insulating substrate and connected to a pad;
a second line spaced apart from the first line and formed from the same layer as the first line and connected to a thin-film transistor (TFT);
a resistance control pattern formed from a different layer than the first line and the second line; and
a first detour pattern and a second detour pattern spaced apart from the first detour pattern, and the first detour pattern and the second detour pattern being formed from a different layer than the first line, the second line, and the resistance control pattern, the first detour pattern electrically connecting the first line to the resistance control pattern, the second detour pattern electrically connecting the second line to the resistance control pattern so that the first line and the second line are electrically connected to each other through the resistance control pattern.

2. The fan-out of claim 1, wherein the resistance control pattern comprises indium tin oxide (ITO) or indium zinc oxide (IZO).

3. The fan-out of claim 1, wherein the first line is connected to a gate pad, and the second line is connected to a gate electrode of the TFT.

4. The fan-out of claim 1, wherein the first line is connected to a data pad, and the second line is connected to a source electrode of the TFT.

5. The fan-out of claim 1, wherein a resistance control portion comprises the first line, the second line, the first detour pattern, and the second detour pattern, and more than two resistance control portions are connected to each other in series.

6. The fan-out of claim 1, wherein the resistance control pattern is arranged in a zigzag shape.

7. The fan-out of claim 1, further comprising:
a first additional resistance control pattern and a second additional resistance control pattern formed from the same layer as the resistance control pattern,
wherein the first line comprises a first extension portion protruding from the first line, and the second line comprises a second extension portion protruding from the second line, and
wherein the first additional resistance control pattern contacts the first line at the first extension portion, and the second additional resistance control pattern contacts the second line at the second extension portion.

8. The fan-out of claim 1, further comprising:
a first additional resistance control pattern and a second additional resistance control pattern formed from the same layer as the resistance control pattern, the first line and the second line being connected to the first detour pattern and the second detour pattern via the first additional resistance control pattern and the second additional resistance control pattern, respectively.

9. The fan-out of claim 8, wherein the first additional resistance control pattern and the second additional resistance control pattern comprise the same material as the resistance control pattern.

10. The fan-out of claim 8, wherein a resistance control portion comprises the first line, the second line, the first detour pattern, and the second detour pattern, and more than two resistance control portions are connected to each other in series.

11. The fan-out of claim 8, wherein the resistance control pattern is arranged in a zigzag shape.

12. The fan-out of claim 1, wherein a plurality of resistance control patterns connect a plurality of first lines to a plurality of second lines, respectively, and a first resistance control pattern has a different length than a second resistance control pattern.

13. The fan-out of claim 8, wherein the first line comprises a first extension portion protruding from the first line, and the second line comprises a second extension portion protruding from the second line, and
wherein the first additional resistance control pattern contacts the first line at the first extension portion, and the second additional resistance control pattern contacts the second line at the second extension portion.

14. A display substrate, comprising:
a fan-out comprising:
an insulating substrate;
a first line disposed on the insulating substrate and connected to a pad;
a second line spaced apart from the first line and formed from the same layer as the first line and connected to a thin-film transistor;
a resistance control pattern formed from a different layer than the first line and the second line; and
a first detour pattern and a second detour pattern spaced apart from the first detour pattern, and the first detour pattern and the second detour pattern being formed from a different layer than the first line, the second line, and the resistance control pattern, the first detour pattern electrically connecting the first line to the resistance control pattern, the second detour pattern electrically connecting the second line to the resistance control pattern so that the first line and the second line are electrically connected to each other through the resistance control pattern; and
a gate line or a data line connected to the fan-out.

15. The display substrate of claim 14, wherein the first detour pattern and the second detour pattern are formed from substantially a same layer as the gate line or the data line.

16. The display substrate of claim 15, wherein the first detour pattern and the second detour pattern comprise at least one of aluminum, chromium, molybdenum, tantalum, or titanium.

17. The display substrate of claim 14, further comprising:
a first additional resistance control pattern and a second additional resistance control pattern formed from the same layer as the resistance control pattern, wherein the first line comprises a first extension portion protruding from the first line, and the second line comprises a second extension portion protruding from the second line, and wherein the first additional resistance control pattern contacts the first line at the first extension portion, and the second additional resistance control pattern contacts the second line at the second extension portion.

18. A method for manufacturing a display substrate, the method comprising:

forming a first line and a second line;

forming a first insulating layer on the first line and the second line;

forming a first contact hole through the first insulating layer to expose the first line or the second line;

forming a first detour pattern connected to the first line through the first contact hole or a second detour pattern connected to the second line through the first contact hole;

forming a second insulating layer on the first detour pattern or the second detour pattern;

forming a second contact hole through the second insulating layer to exposed the first detour pattern or the second detour patter; and forming a resistance control pattern connected to the first detour pattern or the second detour pattern through the second contact hole.

19. A method for manufacturing a display substrate, the method comprising:

forming a first line and a second line;

forming a first insulating layer on the first line and the second line;

forming a first detour pattern or a second detour pattern on the first insulating layer;

forming a second insulating layer on the first detour pattern or the second detour pattern;

patterning the first insulating layer to form contact holes exposing the first line and the second line, and patterning the second insulating layer to form a contact hole exposing the first detour pattern or the second detour pattern; and forming a resistance control pattern connected to the first detour pattern or the second detour pattern via the contact hole in the second insulating layer.

20. The method of claim 19, further comprising forming an additional resistance control pattern connected to the first line or the second line, and the first detour pattern or the second detour pattern.

* * * * *